United States Patent
Long et al.

(10) Patent No.: US 12,191,875 B2
(45) Date of Patent: *Jan. 7, 2025

(54) REDUCING HARMONIC DISTORTION BY DITHERING

(71) Applicant: Ultraleap Limited, Bristol (GB)

(72) Inventors: Benjamin John Oliver Long, Bristol (GB); Brian Kappus, Campbell, CA (US)

(73) Assignee: ULTRALEAP LIMITED, Bristol (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,313

(22) Filed: Aug. 4, 2023

(65) Prior Publication Data

US 2023/0378966 A1    Nov. 23, 2023

Related U.S. Application Data

(63) Continuation of application No. 17/807,730, filed on Jun. 19, 2022, now Pat. No. 11,742,870, which is a (Continued)

(51) Int. Cl.
*H03M 1/20* (2006.01)
*H03M 1/06* (2006.01)
*H03M 3/00* (2006.01)

(52) U.S. Cl.
CPC ......... *H03M 1/0641* (2013.01); *H03M 3/332* (2013.01)

(58) Field of Classification Search
CPC .... H03M 1/0641; H03M 3/332; G10K 11/34; G06F 17/17
See application file for complete search history.

(56) References Cited

U.S. PATENT DOCUMENTS

| 4,218,921 A | 8/1980 | Berge |
| 4,760,525 A | 7/1988 | Webb |

(Continued)

FOREIGN PATENT DOCUMENTS

| CA | 2470115 A1 | 6/2003 |
| CA | 2909804 A1 | 11/2014 |

(Continued)

OTHER PUBLICATIONS

Office Action (Non-Final Rejection) dated Aug. 29, 2022 for U.S. Appl. No. 16/995,819 (pp. 1-6).

(Continued)

*Primary Examiner* — Jean B Jeanglaude
(74) *Attorney, Agent, or Firm* — Koffsky Schwalb LLC; Mark I. Koffsky

(57) ABSTRACT

A digital signal generation assumes that a base frequency (the frequency with which the primitive phase angles are specified relative to) is equal to the carrier frequency for all relevant times. But this causes errors in the digital signals output to each array element transducer. Thus, it is necessary for the development of a signal generation system that is capable of producing a digital signal using the free selection of amplitude and phase. This is used to produce a substantially error-free signal that preserves the amplitude and phase relative to a constant base frequency while allowing the carrier frequency to vary.

11 Claims, 12 Drawing Sheets

Related U.S. Application Data continuation of application No. 17/068,825, filed on Oct. 12, 2020, now Pat. No. 11,374,586.

(60) Provisional application No. 62/914,487, filed on Oct. 13, 2019.

(56) References Cited

U.S. PATENT DOCUMENTS

| | | |
|---|---|---|
| 4,771,205 A | 9/1988 | Mequio |
| 4,881,212 A | 11/1989 | Takeuchi |
| 5,122,993 A | 6/1992 | Hikita |
| 5,226,000 A | 7/1993 | Moses |
| 5,235,986 A | 8/1993 | Maslak |
| 5,243,344 A | 9/1993 | Koulopoulos |
| 5,329,682 A | 7/1994 | Thurn |
| 5,371,834 A | 12/1994 | Tawel |
| 5,422,431 A | 6/1995 | Ichiki |
| 5,426,388 A | 6/1995 | Flora |
| 5,477,736 A | 12/1995 | Lorraine |
| 5,511,296 A | 4/1996 | Dias |
| 5,729,694 A | 3/1998 | Holzrichter |
| 5,859,915 A | 1/1999 | Norris |
| 6,029,518 A | 2/2000 | Oeftering |
| 6,193,936 B1 | 2/2001 | Gardner |
| 6,216,538 B1 | 4/2001 | Yasuda |
| 6,436,051 B1 | 8/2002 | Morris |
| 6,503,204 B1 | 1/2003 | Sumanaweera |
| 6,647,359 B1 | 11/2003 | Verplank |
| 6,771,294 B1 | 8/2004 | Pulli |
| 6,772,490 B2 | 8/2004 | Toda |
| 6,800,987 B2 | 10/2004 | Toda |
| 7,107,159 B2 | 9/2006 | German |
| 7,109,789 B2 | 9/2006 | Spencer |
| 7,154,928 B2 * | 12/2006 | Sandstrom ......... G03F 7/70575 372/55 |
| 7,182,726 B2 | 2/2007 | Williams |
| 7,225,404 B1 | 5/2007 | Zilles |
| 7,284,027 B2 | 10/2007 | Jennings, III |
| 7,345,600 B1 | 3/2008 | Fedigan |
| 7,487,662 B2 | 2/2009 | Schabron |
| 7,497,662 B2 | 3/2009 | Mollmann |
| 7,577,260 B1 | 8/2009 | Hooley |
| 7,692,661 B2 | 4/2010 | Cook |
| RE42,192 E | 3/2011 | Schabron |
| 7,966,134 B2 | 6/2011 | German |
| 8,000,481 B2 | 8/2011 | Nishikawa |
| 8,123,502 B2 | 2/2012 | Blakey |
| 8,269,168 B1 | 9/2012 | Axelrod |
| 8,279,193 B1 | 10/2012 | Birnbaum |
| 8,351,646 B2 | 1/2013 | Fujimura |
| 8,369,973 B2 | 2/2013 | Risbo |
| 8,594,350 B2 | 11/2013 | Hooley |
| 8,607,922 B1 | 12/2013 | Werner |
| 8,782,109 B2 | 7/2014 | Tsutsui |
| 8,823,674 B2 | 9/2014 | Birnbaum |
| 8,833,510 B2 | 9/2014 | Koh |
| 8,884,927 B1 | 11/2014 | Cheatham, III |
| 9,208,664 B1 | 12/2015 | Peters |
| 9,267,735 B2 | 2/2016 | Funayama |
| 9,421,291 B2 | 8/2016 | Robert |
| 9,612,658 B2 | 4/2017 | Subramanian |
| 9,662,680 B2 | 5/2017 | Yamamoto |
| 9,667,173 B1 | 5/2017 | Kappus |
| 9,816,757 B1 | 11/2017 | Zielinski |
| 9,841,819 B2 | 12/2017 | Carter |
| 9,863,699 B2 | 1/2018 | Corbin, III |
| 9,898,089 B2 | 2/2018 | Subramanian |
| 9,936,908 B1 | 4/2018 | Acosta |
| 9,945,818 B2 | 4/2018 | Ganti |
| 9,958,943 B2 | 5/2018 | Long |
| 9,977,120 B2 | 5/2018 | Carter |
| 10,101,811 B2 | 10/2018 | Carter |
| 10,101,814 B2 | 10/2018 | Carter |
| 10,133,353 B2 | 11/2018 | Eid |
| 10,140,776 B2 | 11/2018 | Schwarz |
| 10,146,353 B1 | 12/2018 | Smith |
| 10,168,782 B1 | 1/2019 | Tchon |
| 10,268,275 B2 | 4/2019 | Carter |
| 10,281,567 B2 | 5/2019 | Carter |
| 10,318,008 B2 | 6/2019 | Sinha |
| 10,444,842 B2 | 10/2019 | Long |
| 10,469,973 B2 | 11/2019 | Hayashi |
| 10,496,175 B2 | 12/2019 | Long |
| 10,497,358 B2 | 12/2019 | Tester |
| 10,510,357 B2 | 12/2019 | Kovesi |
| 10,520,252 B2 | 12/2019 | Momen |
| 10,523,159 B2 | 12/2019 | Megretski |
| 10,531,212 B2 | 1/2020 | Long |
| 10,535,174 B1 | 1/2020 | Rigiroli |
| 10,569,300 B2 | 2/2020 | Hoshi |
| 10,593,101 B1 | 3/2020 | Han |
| 10,599,434 B1 | 3/2020 | Barrett |
| 10,657,704 B1 | 5/2020 | Han |
| 10,685,538 B2 | 6/2020 | Carter |
| 10,755,538 B2 | 8/2020 | Carter |
| 10,818,162 B2 | 10/2020 | Carter |
| 10,911,861 B2 | 2/2021 | Buckland |
| 10,915,177 B2 | 2/2021 | Carter |
| 10,921,890 B2 | 2/2021 | Subramanian |
| 10,930,123 B2 | 2/2021 | Carter |
| 10,943,578 B2 | 3/2021 | Long |
| 10,991,074 B2 | 4/2021 | Bousmalis |
| 11,048,329 B1 | 6/2021 | Lee |
| 11,080,874 B1 | 8/2021 | Bardagjy |
| 11,098,951 B2 | 8/2021 | Kappus |
| 11,106,273 B2 | 8/2021 | Hazra |
| 11,113,860 B2 | 9/2021 | Rigiroli |
| 11,125,866 B2 | 9/2021 | Sumi |
| 11,169,610 B2 | 11/2021 | Sarafianou |
| 11,189,140 B2 | 11/2021 | Long |
| 11,204,644 B2 | 12/2021 | Long |
| 11,276,281 B2 | 3/2022 | Carter |
| 11,350,909 B2 | 6/2022 | Maresca |
| 11,531,395 B2 | 12/2022 | Kappus |
| 11,543,507 B2 | 1/2023 | Carter |
| 11,550,395 B2 | 1/2023 | Beattie |
| 11,550,432 B2 | 1/2023 | Carter |
| 11,553,295 B2 | 1/2023 | Kappus |
| 11,693,113 B2 | 7/2023 | Bachmann |
| 11,714,492 B2 | 8/2023 | Carter |
| 11,715,453 B2 | 8/2023 | Kappus |
| 11,727,790 B2 | 8/2023 | Carter |
| 11,740,018 B2 | 8/2023 | Kappus |
| 11,742,870 B2 | 8/2023 | Long |
| 11,768,540 B2 | 9/2023 | Long |
| 11,816,267 B2 | 11/2023 | Kappus |
| 11,842,517 B2 | 12/2023 | Lyons |
| 11,886,639 B2 | 1/2024 | Brown |
| 11,921,928 B2 | 3/2024 | Iodice |
| 11,955,109 B2 | 4/2024 | Long |
| 2001/0007591 A1 | 7/2001 | Pompei |
| 2001/0033124 A1 | 10/2001 | Norris |
| 2002/0149570 A1 | 10/2002 | Knowles |
| 2003/0024317 A1 | 2/2003 | Miller |
| 2003/0144032 A1 | 7/2003 | Brunner |
| 2003/0182647 A1 | 9/2003 | Radeskog |
| 2004/0005715 A1 | 1/2004 | Schabron |
| 2004/0014434 A1 | 1/2004 | Haardt |
| 2004/0052387 A1 | 3/2004 | Norris |
| 2004/0091119 A1 | 5/2004 | Duraiswami |
| 2004/0210158 A1 | 10/2004 | Organ |
| 2004/0226378 A1 | 11/2004 | Oda |
| 2004/0264707 A1 | 12/2004 | Yang |
| 2005/0052714 A1 | 3/2005 | Klug |
| 2005/0056851 A1 | 3/2005 | Althaus |
| 2005/0148874 A1 | 7/2005 | Brock-Fisher |
| 2005/0212760 A1 | 9/2005 | Marvit |
| 2005/0226437 A1 | 10/2005 | Pellegrini |
| 2005/0267695 A1 | 12/2005 | German |
| 2005/0273483 A1 | 12/2005 | Dent |
| 2006/0085049 A1 | 4/2006 | Cory |
| 2006/0090955 A1 | 5/2006 | Cardas |
| 2006/0091301 A1 | 5/2006 | Trisnadi |

(56) References Cited

U.S. PATENT DOCUMENTS

| | | |
|---|---|---|
| 2006/0164428 A1 | 7/2006 | Cook |
| 2007/0036492 A1 | 2/2007 | Lee |
| 2007/0056374 A1 | 3/2007 | Andrews |
| 2007/0094317 A1 | 4/2007 | Wang |
| 2007/0177681 A1 | 8/2007 | Choi |
| 2007/0214462 A1 | 9/2007 | Boillot |
| 2007/0236450 A1 | 10/2007 | Colgate |
| 2007/0263741 A1 | 11/2007 | Erving |
| 2008/0012647 A1 | 1/2008 | Risbo |
| 2008/0027686 A1 | 1/2008 | Mollmann |
| 2008/0084789 A1 | 4/2008 | Altman |
| 2008/0130906 A1 | 6/2008 | Goldstein |
| 2008/0152191 A1 | 6/2008 | Fujimura |
| 2008/0226088 A1 | 9/2008 | Aarts |
| 2008/0273723 A1 | 11/2008 | Hartung |
| 2008/0300055 A1 | 12/2008 | Lutnick |
| 2009/0093724 A1 | 4/2009 | Pernot |
| 2009/0116660 A1 | 5/2009 | Croft, III |
| 2009/0232684 A1 | 9/2009 | Hirata |
| 2009/0251421 A1 | 10/2009 | Bloebaum |
| 2009/0319065 A1 | 12/2009 | Risbo |
| 2010/0013613 A1 | 1/2010 | Weston |
| 2010/0016727 A1 | 1/2010 | Rosenberg |
| 2010/0030076 A1 | 2/2010 | Vortman |
| 2010/0044120 A1 | 2/2010 | Richter |
| 2010/0066512 A1 | 3/2010 | Rank |
| 2010/0085168 A1 | 4/2010 | Kyung |
| 2010/0103246 A1 | 4/2010 | Schwerdtner |
| 2010/0109481 A1 | 5/2010 | Buccafusca |
| 2010/0199232 A1 | 8/2010 | Mistry |
| 2010/0231508 A1 | 9/2010 | Cruz-Hernandez |
| 2010/0262008 A1 | 10/2010 | Roundhill |
| 2010/0302015 A1 | 12/2010 | Kipman |
| 2010/0321216 A1 | 12/2010 | Jonsson |
| 2011/0006888 A1 | 1/2011 | Bae |
| 2011/0010958 A1 | 1/2011 | Clark |
| 2011/0051554 A1 | 3/2011 | Varray |
| 2011/0066032 A1 | 3/2011 | Shuki |
| 2011/0199342 A1 | 8/2011 | Vartanian |
| 2011/0310028 A1 | 12/2011 | Camp, Jr. |
| 2012/0057733 A1 | 3/2012 | Morii |
| 2012/0063628 A1 | 3/2012 | Rizzello |
| 2012/0066280 A1 | 3/2012 | Tsutsui |
| 2012/0223880 A1 | 9/2012 | Birnbaum |
| 2012/0229400 A1 | 9/2012 | Birnbaum |
| 2012/0229401 A1 | 9/2012 | Birnbaum |
| 2012/0236689 A1 | 9/2012 | Brown |
| 2012/0243374 A1 | 9/2012 | Dahl |
| 2012/0249409 A1 | 10/2012 | Toney |
| 2012/0249474 A1 | 10/2012 | Pratt |
| 2012/0299853 A1 | 11/2012 | Dagar |
| 2012/0307649 A1 | 12/2012 | Park |
| 2012/0315605 A1 | 12/2012 | Cho |
| 2013/0035582 A1 | 2/2013 | Radulescu |
| 2013/0079621 A1 | 3/2013 | Shoham |
| 2013/0094678 A1 | 4/2013 | Scholte |
| 2013/0100008 A1 | 4/2013 | Marti |
| 2013/0101141 A1 | 4/2013 | McElveen |
| 2013/0173658 A1 | 7/2013 | Adelman |
| 2013/0271397 A1 | 10/2013 | MacDougall |
| 2013/0331705 A1 | 12/2013 | Fraser |
| 2014/0027201 A1 | 1/2014 | Islam |
| 2014/0104274 A1 | 4/2014 | Hilliges |
| 2014/0139071 A1 | 5/2014 | Yamamoto |
| 2014/0168091 A1 | 6/2014 | Jones |
| 2014/0201666 A1 | 7/2014 | Bedikian |
| 2014/0204002 A1 | 7/2014 | Bennet |
| 2014/0265572 A1 | 9/2014 | Siedenburg |
| 2014/0267065 A1 | 9/2014 | Levesque |
| 2014/0269207 A1 | 9/2014 | Baym |
| 2014/0269208 A1 | 9/2014 | Baym |
| 2014/0269214 A1 | 9/2014 | Baym |
| 2014/0270305 A1 | 9/2014 | Baym |
| 2014/0320436 A1 | 10/2014 | Modarres |
| 2014/0361988 A1 | 12/2014 | Katz |
| 2014/0369514 A1 | 12/2014 | Baym |
| 2015/0002477 A1 | 1/2015 | Cheatham, III |
| 2015/0005039 A1 | 1/2015 | Liu |
| 2015/0006645 A1 | 1/2015 | Oh |
| 2015/0007025 A1 | 1/2015 | Sassi |
| 2015/0013023 A1 | 1/2015 | Wang |
| 2015/0019299 A1 | 1/2015 | Harvey |
| 2015/0022466 A1 | 1/2015 | Levesque |
| 2015/0029155 A1 | 1/2015 | Lee |
| 2015/0066445 A1 | 3/2015 | Lin |
| 2015/0070147 A1 | 3/2015 | Cruz-Hernandez |
| 2015/0070245 A1 | 3/2015 | Han |
| 2015/0078136 A1 | 3/2015 | Sun |
| 2015/0081110 A1 | 3/2015 | Houston |
| 2015/0084929 A1 | 3/2015 | Lee |
| 2015/0110310 A1 | 4/2015 | Minnaar |
| 2015/0130323 A1 | 5/2015 | Harris |
| 2015/0168205 A1 | 6/2015 | Lee |
| 2015/0192995 A1 | 7/2015 | Subramanian |
| 2015/0209564 A1 | 7/2015 | Lewin |
| 2015/0220199 A1 | 8/2015 | Wang |
| 2015/0226537 A1 | 8/2015 | Schorre |
| 2015/0226831 A1 | 8/2015 | Nakamura |
| 2015/0241393 A1 | 8/2015 | Ganti |
| 2015/0248787 A1 | 9/2015 | Abovitz |
| 2015/0258431 A1 | 9/2015 | Stafford |
| 2015/0277610 A1 | 10/2015 | Kim |
| 2015/0293592 A1 | 10/2015 | Cheong |
| 2015/0304789 A1 | 10/2015 | Babayoff |
| 2015/0309629 A1 | 10/2015 | Amariutei |
| 2015/0323667 A1 | 11/2015 | Przybyla |
| 2015/0331576 A1 | 11/2015 | Piya |
| 2015/0332075 A1 | 11/2015 | Burch |
| 2016/0019762 A1 | 1/2016 | Levesque |
| 2016/0019879 A1 | 1/2016 | Daley |
| 2016/0026253 A1 | 1/2016 | Bradski |
| 2016/0044417 A1 | 2/2016 | Clemen, Jr. |
| 2016/0124080 A1 | 5/2016 | Carter |
| 2016/0138986 A1 | 5/2016 | Carlin |
| 2016/0175701 A1 | 6/2016 | Froy |
| 2016/0175709 A1 | 6/2016 | Idris |
| 2016/0189702 A1 | 6/2016 | Blanc |
| 2016/0242724 A1 | 8/2016 | Lavallee |
| 2016/0246374 A1 | 8/2016 | Carter |
| 2016/0249150 A1 | 8/2016 | Carter |
| 2016/0291716 A1 | 10/2016 | Boser |
| 2016/0306423 A1 | 10/2016 | Uttermann |
| 2016/0320843 A1 | 11/2016 | Long |
| 2016/0339132 A1 | 11/2016 | Cosman |
| 2016/0358477 A1 | 12/2016 | Ansari |
| 2016/0374562 A1 | 12/2016 | Vertikov |
| 2017/0002839 A1 | 1/2017 | Bukland |
| 2017/0004819 A1 | 1/2017 | Ochiai |
| 2017/0018171 A1 | 1/2017 | Carter |
| 2017/0024921 A1 | 1/2017 | Beeler |
| 2017/0052148 A1 | 2/2017 | Estevez |
| 2017/0123487 A1 | 5/2017 | Hazra |
| 2017/0123499 A1 | 5/2017 | Eid |
| 2017/0140552 A1 | 5/2017 | Woo |
| 2017/0144190 A1 | 5/2017 | Hoshi |
| 2017/0153707 A1 | 6/2017 | Subramanian |
| 2017/0168586 A1 | 6/2017 | Sinha |
| 2017/0181725 A1 | 6/2017 | Han |
| 2017/0193768 A1 | 7/2017 | Long |
| 2017/0193823 A1 | 7/2017 | Jiang |
| 2017/0211022 A1 | 7/2017 | Reinke |
| 2017/0236506 A1 | 8/2017 | Przybyla |
| 2017/0249932 A1 | 8/2017 | Maxwell |
| 2017/0270356 A1 | 9/2017 | Sills |
| 2017/0279951 A1 | 9/2017 | Hwang |
| 2017/0336860 A1 | 11/2017 | Smoot |
| 2017/0366908 A1 | 12/2017 | Long |
| 2018/0035891 A1 | 2/2018 | Van Soest |
| 2018/0039333 A1 | 2/2018 | Carter |
| 2018/0047259 A1 | 2/2018 | Carter |
| 2018/0074580 A1 | 3/2018 | Hardee |
| 2018/0081439 A1 | 3/2018 | Daniels |
| 2018/0101234 A1 | 4/2018 | Carter |
| 2018/0139557 A1 | 5/2018 | Ochiai |

(56) References Cited

U.S. PATENT DOCUMENTS

| | | |
|---|---|---|
| 2018/0146306 A1 | 5/2018 | Benattar |
| 2018/0151035 A1 | 5/2018 | Maalouf |
| 2018/0166063 A1 | 6/2018 | Long |
| 2018/0181203 A1 | 6/2018 | Subramanian |
| 2018/0182372 A1 | 6/2018 | Tester |
| 2018/0190007 A1 | 7/2018 | Panteleev |
| 2018/0246576 A1 | 8/2018 | Long |
| 2018/0253627 A1 | 9/2018 | Baradel |
| 2018/0267156 A1 | 9/2018 | Carter |
| 2018/0271494 A1 | 9/2018 | Cuscuna |
| 2018/0304310 A1 | 10/2018 | Long |
| 2018/0309515 A1 | 10/2018 | Murakowski |
| 2018/0310111 A1 | 10/2018 | Kappus |
| 2018/0350339 A1 | 12/2018 | Macours |
| 2018/0361174 A1 | 12/2018 | Radulescu |
| 2019/0001129 A1 | 1/2019 | Rosenbluth |
| 2019/0038496 A1 | 2/2019 | Levesque |
| 2019/0091565 A1 | 3/2019 | Nelson |
| 2019/0163275 A1 | 5/2019 | Iodice |
| 2019/0175077 A1 | 6/2019 | Zhang |
| 2019/0187244 A1 | 6/2019 | Riccardi |
| 2019/0196578 A1 | 6/2019 | Iodice |
| 2019/0196591 A1 | 6/2019 | Long |
| 2019/0197840 A1 | 6/2019 | Kappus |
| 2019/0197841 A1 | 6/2019 | Carter |
| 2019/0197842 A1 | 6/2019 | Long |
| 2019/0204925 A1 | 7/2019 | Long |
| 2019/0206202 A1 | 7/2019 | Carter |
| 2019/0235628 A1 | 8/2019 | Lacroix |
| 2019/0257932 A1 | 8/2019 | Carter |
| 2019/0310710 A1 | 10/2019 | Deeley |
| 2019/0342654 A1 | 11/2019 | Buckland |
| 2020/0042091 A1 | 2/2020 | Long |
| 2020/0080776 A1 | 3/2020 | Kappus |
| 2020/0082221 A1 | 3/2020 | Tsai |
| 2020/0082804 A1 | 3/2020 | Kappus |
| 2020/0103974 A1 | 4/2020 | Carter |
| 2020/0117229 A1 | 4/2020 | Long |
| 2020/0193269 A1 | 6/2020 | Park |
| 2020/0218354 A1 | 7/2020 | Beattie |
| 2020/0257371 A1 | 8/2020 | Sung |
| 2020/0294299 A1 | 9/2020 | Rigiroli |
| 2020/0302760 A1 | 9/2020 | Carter |
| 2020/0320347 A1 | 10/2020 | Nikolenko |
| 2020/0327418 A1 | 10/2020 | Lyons |
| 2020/0380832 A1 | 12/2020 | Carter |
| 2021/0037332 A1 | 2/2021 | Kappus |
| 2021/0043070 A1 | 2/2021 | Carter |
| 2021/0056693 A1 | 2/2021 | Cheng |
| 2021/0109712 A1 | 4/2021 | Long |
| 2021/0111731 A1 | 4/2021 | Long |
| 2021/0112353 A1 | 4/2021 | Kappus |
| 2021/0141458 A1 | 5/2021 | Sarafianou |
| 2021/0165491 A1 | 6/2021 | Sun |
| 2021/0170447 A1 | 6/2021 | Buckland |
| 2021/0183215 A1 | 6/2021 | Carter |
| 2021/0201884 A1 | 7/2021 | Kappus |
| 2021/0225355 A1 | 7/2021 | Long |
| 2021/0275141 A1 | 9/2021 | Eckersley |
| 2021/0303072 A1 | 9/2021 | Carter |
| 2021/0303758 A1 | 9/2021 | Long |
| 2021/0334706 A1 | 10/2021 | Yamaguchi |
| 2021/0381765 A1 | 12/2021 | Kappus |
| 2021/0397261 A1 | 12/2021 | Kappus |
| 2022/0000447 A1 | 1/2022 | Eibl |
| 2022/0035479 A1 | 2/2022 | Lasater |
| 2022/0083142 A1 | 3/2022 | Brown |
| 2022/0095068 A1 | 3/2022 | Kappus |
| 2022/0113806 A1 | 4/2022 | Long |
| 2022/0155949 A1 | 5/2022 | Ring |
| 2022/0198892 A1 | 6/2022 | Carter |
| 2022/0236806 A1 | 7/2022 | Carter |
| 2022/0252550 A1 | 8/2022 | Catsis |
| 2022/0300028 A1 | 9/2022 | Long |
| 2022/0300070 A1 | 9/2022 | Iodice |
| 2022/0329250 A1 | 10/2022 | Long |
| 2022/0393095 A1 | 12/2022 | Chilles |
| 2023/0036123 A1 | 2/2023 | Long |
| 2023/0075917 A1 | 3/2023 | Pittera |
| 2023/0117919 A1 | 4/2023 | Iodice |
| 2023/0124704 A1 | 4/2023 | Buckland |
| 2023/0141896 A1 | 5/2023 | Liu |
| 2023/0168228 A1 | 6/2023 | Brian |
| 2023/0215248 A1 | 7/2023 | Lowther |
| 2023/0228857 A1 | 7/2023 | Carter |
| 2023/0251720 A1 | 8/2023 | William |
| 2023/0259213 A1 | 8/2023 | Long |
| 2023/0298444 A1 | 9/2023 | Kappus |
| 2023/0360504 A1 | 11/2023 | Kappus |
| 2023/0368771 A1 | 11/2023 | Kappus |
| 2024/0021072 A1 | 1/2024 | Carter |
| 2024/0056655 A1 | 2/2024 | Page |
| 2024/0069640 A1 | 2/2024 | Long |
| 2024/0095953 A1 | 3/2024 | Lyons |
| 2024/0096183 A1 | 3/2024 | Carter |
| 2024/0129655 A1 | 4/2024 | Chilles |

FOREIGN PATENT DOCUMENTS

| | | |
|---|---|---|
| CN | 101986787 | 3/2011 |
| CN | 102459900 | 5/2012 |
| CN | 102591512 | 7/2012 |
| CN | 103797379 | 5/2014 |
| CN | 103984414 A | 8/2014 |
| CN | 107340871 A | 11/2017 |
| CN | 107407969 A | 11/2017 |
| CN | 107534810 A | 1/2018 |
| EP | 0057594 A2 | 8/1982 |
| EP | 309003 | 3/1989 |
| EP | 0696670 A1 | 2/1996 |
| EP | 1875081 A1 | 1/2008 |
| EP | 1911530 | 4/2008 |
| EP | 2271129 A1 | 1/2011 |
| EP | 1461598 B1 | 4/2014 |
| EP | 3207817 A1 | 8/2017 |
| EP | 3216231 B1 | 8/2019 |
| EP | 3916525 | 12/2021 |
| GB | 2464117 | 4/2010 |
| GB | 2513884 A | 11/2014 |
| GB | 2530036 | 3/2016 |
| JP | 2008074075 | 4/2008 |
| JP | 2010109579 | 5/2010 |
| JP | 2011172074 | 9/2011 |
| JP | 2012048378 A | 3/2012 |
| JP | 5477736 B2 | 4/2014 |
| JP | 2015035657 A | 2/2015 |
| JP | 2016035646 | 3/2016 |
| JP | 2017168086 | 9/2017 |
| JP | 6239796 | 11/2017 |
| KR | 20120065779 | 6/2012 |
| KR | 20130055972 | 5/2013 |
| KR | 1020130055972 | 5/2013 |
| KR | 20160008280 | 1/2016 |
| KR | 20200082449 A | 7/2020 |
| TW | 201308837 | 2/2013 |
| WO | 9118486 | 11/1991 |
| WO | 9639754 | 12/1996 |
| WO | 03050511 A | 6/2003 |
| WO | 2005017965 | 2/2005 |
| WO | 2007144801 A2 | 12/2007 |
| WO | 2009071746 A1 | 6/2009 |
| WO | 2009112866 | 9/2009 |
| WO | 2010003836 | 1/2010 |
| WO | 2010139916 | 12/2010 |
| WO | 2011132012 A1 | 10/2011 |
| WO | 2012023864 | 2/2012 |
| WO | 2012104648 A1 | 8/2012 |
| WO | 2013179179 | 12/2013 |
| WO | 2014181084 A1 | 11/2014 |
| WO | 2015006467 | 1/2015 |
| WO | 2015039622 | 3/2015 |
| WO | 2015127335 | 8/2015 |
| WO | 2015194510 | 12/2015 |
| WO | 2016007920 | 1/2016 |

(56) References Cited

FOREIGN PATENT DOCUMENTS

| WO | 2016073936 | | 5/2016 |
|---|---|---|---|
| WO | 2016095033 | A1 | 6/2016 |
| WO | 2016099279 | | 6/2016 |
| WO | 2016132141 | | 8/2016 |
| WO | 2016132144 | | 8/2016 |
| WO | 2016137675 | | 9/2016 |
| WO | 2016162058 | | 10/2016 |
| WO | 2016171651 | | 10/2016 |
| WO | 2017172006 | | 10/2017 |
| WO | 2018109466 | A1 | 6/2018 |
| WO | 2018168562 | A1 | 9/2018 |
| WO | 2019190894 | | 10/2019 |
| WO | 2020049321 | A2 | 3/2020 |
| WO | 2021130505 | A1 | 7/2021 |
| WO | 2021260373 | A1 | 12/2021 |
| WO | 2021262343 | | 12/2021 |

OTHER PUBLICATIONS

Office Action (Non-Final Rejection) dated Sep. 21, 2022 for U.S. Appl. No. 17/721,315 (pp. 1-10).
Office Action (Non-Final Rejection) dated Oct. 17, 2022 for U.S. Appl. No. 17/807,730 (pp. 1-8).
Office Action (Non-Final Rejection) dated Nov. 9, 2022 for U.S. Appl. No. 17/454,823 (pp. 1-16).
Office Action (Non-Final Rejection) dated Nov. 16, 2022 for U.S. Appl. No. 17/134,505 (pp. 1-7).
Office Action (Non-Final Rejection) dated Nov. 16, 2022 for U.S. Appl. No. 17/692,852 (pp. 1-4).
Office Action (Non-Final Rejection) dated Dec. 6, 2022 for U.S. Appl. No. 17/409,783 (pp. 1-7).
Office Action (Non-Final Rejection) dated Dec. 20, 2021 for U.S. Appl. No. 17/195,795 (pp. 1-7).
Office Action (Non-Final Rejection) dated Dec. 22, 2022 for U.S. Appl. No. 17/457,663 (pp. 1-20).
Office Action (Notice of Allowance and Fees Due (PTOL-85)) dated Jan. 18, 2022 for U.S. Appl. No. 16/899,720 (pp. 1-2).
Office Action (Notice of Allowance and Fees Due (PTOL-85)) dated Feb. 11, 2022 for U.S. Appl. No. 16/228,760 (pp. 1-8).
Office Action (Notice of Allowance and Fees Due (PTOL-85)) dated Feb. 28, 2022 for U.S. Appl. No. 17/068,825 (pp. 1-7).
Office Action (Notice of Allowance and Fees Due (PTOL-85)) dated Mar. 7, 2022 for U.S. Appl. No. 16/600,496 (pp. 1-5).
Office Action (Notice of Allowance and Fees Due (PTOL-85)) dated Mar. 8, 2023 for U.S. Appl. No. 17/721,315 (pp. 1-8).
Office Action (Notice of Allowance and Fees Due (PTOL-85)) dated Mar. 15, 2023 for U.S. Appl. No. 17/134,505 (pp. 1-5).
Office Action (Notice of Allowance and Fees Due (PTOL-85)) dated Mar. 24, 2023 for U.S. Appl. No. 17/080,840 (pp. 1-8).
Office Action (Notice of Allowance and Fees Due (PTOL-85)) dated Apr. 4, 2023 for U.S. Appl. No. 17/409,783 (pp. 1-5).
Office Action (Notice of Allowance and Fees Due (PTOL-85)) dated Apr. 6, 2023 for U.S. Appl. No. 17/807,730 (pp. 1-7).
Office Action (Notice of Allowance and Fees Due (PTOL-85)) dated Apr. 28, 2023 for U.S. Appl. No. 17/195,795 (pp. 1-7).
Office Action (Notice of Allowance and Fees Due (PTOL-85)) dated May 12, 2023 for U.S. Appl. No. 16/229,091 (pp. 1-8).
Office Action (Notice of Allowance and Fees Due (PTOL-85)) dated May 24, 2023 for U.S. Appl. No. 16/229,091 (pp. 1-2).
Office Action (Notice of Allowance and Fees Due (PTOL-85)) dated Jun. 16, 2023 for U.S. Appl. No. 17/354,636 (pp. 1-7).
Office Action (Notice of Allowance and Fees Due (PTOL-85)) dated Jul. 20, 2023 for U.S. Appl. No. 17/692,852 (pp. 1-8).
Office Action (Notice of Allowance and Fees Due (PTOL-85)) dated Aug. 2, 2023 for U.S. Appl. No. 16/843,281 (pp. 1-5).
Office Action (Notice of Allowance and Fees Due (PTOL-85)) dated Aug. 24, 2022 for U.S. Appl. No. 16/198,959 (pp. 1-6).
Office Action (Notice of Allowance and Fees Due (PTOL-85)) dated Aug. 31, 2022 for U.S. Appl. No. 16/198,959 (pp. 1-2).
Office Action (Notice of Allowance and Fees Due (PTOL-85)) dated Sep. 7, 2022 for U.S. Appl. No. 17/068,834 (pp. 1-8).
Office Action (Notice of Allowance and Fees Due (PTOL-85)) dated Sep. 8, 2022 for U.S. Appl. No. 17/176,899 (pp. 1-8).
Office Action (Notice of Allowance and Fees Due (PTOL-85)) dated Sep. 12, 2022 for U.S. Appl. No. 16/734,479 (pp. 1-7).
Office Action (Notice of Allowance and Fees Due (PTOL-85)) dated Oct. 31, 2022 for U.S. Appl. No. 17/068,834 (pp. 1-2).
Office Action (Notice of Allowance and Fees Due (PTOL-85)) dated Oct. 31, 2022 for U.S. Appl. No. 17/176,899 (pp. 1-2).
Office Action (Notice of Allowance and Fees Due (PTOL-85)) dated Nov. 1, 2022 for U.S. Appl. No. 16/404,660 (pp. 1-5).
Office Action (Notice of Allowance and Fees Due (PTOL-85)) dated Nov. 2, 2022 for U.S. Appl. No. 16/734,479 (pp. 1-2).
Office Action (Notice of Allowance and Fees Due (PTOL-85)) dated Nov. 10, 2022 for U.S. Appl. No. 16/198,959 (pp. 1-2).
Office Action (Notice of Allowance and Fees Due (PTOL-85)) dated Nov. 16, 2022 for U.S. Appl. No. 16/404,660 (pp. 1-2).
Office Action (Notice of Allowance and Fees Due (PTOL-85)) dated Dec. 14, 2021 for U.S. Appl. No. 17/170,841 (pp. 1-8).
Office Action dated Feb. 9, 2023 for U.S. Appl. No. 18/060,556 (pp. 1-5).
Office Action dated Mar. 3, 2023 for U.S. Appl. No. 18/060,525 (pp. 1-12).
Office Action dated Apr. 19, 2023 for U.S. Appl. No. 18/066,267 (pp. 1-11).
Office Action dated Apr. 8, 2020, for U.S. Appl. No. 16/198,959 (pp. 1-17).
Office Action dated Apr. 16, 2020 for US App. No. 15/839, 184 (pp. 1-8).
Office Action dated Apr. 17, 2020 for U.S. Appl. No. 16/401,148 (pp. 1-15).
Office Action dated Apr. 18, 2019 for US App. No. 16/296, 127 (pp. 1-6).
Office Action dated Apr. 28, 2020 for U.S. Appl. No. 15/396,851 (pp. 1-12).
Office Action dated Apr. 29, 2020 for U.S. Appl. No. 16/374,301 (pp. 1-18).
Office Action dated Apr. 4, 2019 for U.S. Appl. No. 15/897,804 (pp. 1-10).
Office Action dated Aug. 10, 2021 for U.S. Appl. No. 16/564,016 (pp. 1-14).
Office Action dated Aug. 19, 2021 for U.S. Appl. No. 17/170,841 (pp. 1-9).
Office Action dated Aug. 22, 2019 for U.S. Appl. No. 16/160,862 (pp. 1-5).
Office Action dated Aug. 9, 2021 for U.S. Appl. No. 17/068,825 (pp. 1-9).
"Welcome to Project Soli" video, https://atap.google.com/#project-soli Accessed Nov. 30, 2018, 2 pages.
A. B. Vallbo, Receptive field characteristics of tactile units with myelinated afferents in hairy skin of human subjects, Journal of Physiology (1995), 483.3, pp. 783-795.
A. Sand, Head-Mounted Display with Mid-Air Tactile Feedback, Proceedings of the 21st ACM Symposium on Virtual Reality Software and Technology, Nov. 13-15, 2015 (8 pages).
Aksel Sveier et al.,Pose Estimation with Dual Quaternions and Iterative Closest Point, 2018 Annual American Control Conference (ACC) (8 pages).
Al-Mashhadany, "Inverse Kinematics Problem (IKP) of 6-DOF Manipulator by Locally Recurrent Neural Networks (LRNNs)," Management and Service Science (MASS), International Conference on Management and Service Science., IEEE, Aug. 24, 2010, 5 pages. (Year: 2010).
Alexander, J. et al. (2011), Adding Haptic Feedback to Mobile TV (6 pages).
Almusawi et al., "A new artificial neural network approach in solving inverse kinematics of robotic arm (denso vp6242)." Computational intelligence and neuroscience 2016 (2016). (Year: 2016).
Amanda Zimmerman, The gentle touch receptors of mammalian skin, Science, Nov. 21, 2014, vol. 346 Issue 6212, p. 950.
Anonymous: "How does Ultrahaptics technology work?— Ultrahaptics Developer Information", Jul. 31, 2018 (Jul. 31, 2018),

(56) References Cited

OTHER PUBLICATIONS

XP055839320, Retrieved from the Internet: URL:https://developer.ultrahaptics.com/knowledgebase/haptics-overview/ [retrieved on Sep. 8, 2021].
Aoki et al., Sound location of stero reproduction with parametric loudspeakers, Applied Acoustics 73 (2012) 1289-1295 (7 pages).
Ashish Shrivastava et al., Learning from Simulated and Unsupervised Images through Adversarial Training, Jul. 19, 2017, pp. 1-16.
Azad et al., Deep domain adaptation under deep label scarcity. arXiv preprint arXiv:1809.08097 (2018) (Year: 2018).
Bajard et al., BKM: A New Hardware Algorithm for Complex Elementary Functions, 8092 IEEE Transactions on Computers 43 (1994) (9 pages).
Bajard et al., Evaluation of Complex Elementary Functions / A New Version of BKM, SPIE Conference on Advanced Signal Processing, Jul. 1999 (8 pages).
Benjamin Long et al., "Rendering volumetric haptic shapes in mid-air using ultrasound", ACM Transactions on Graphics (TOG), ACM, US, (20141119), vol. 33, No. 6, ISSN 0730-0301, pp. 1-10.
Beranek, L., & Mellow, T. (2019). Acoustics: Sound Fields, Transducers and Vibration. Academic Press, 3 pages.
Bortoff et al., Pseudolinearization of the Acrobot using Spline Functions, IEEE Proceedings of the 31st Conference on Decision and Control, Sep. 10, 1992 (6 pages).
Boureau et al.,"A theoretical analysis of feature pooling in visual recognition." In Proceedings of the 27th international conference on machine learning (ICML-10), pp. 111-118. 2010. (Year: 2010).
Bożena Smagowska & Małgorzata Pawlaczyk-Łuszczyńska (2013) Effects of Ultrasonic Noise on the Human Body—A Bibliographic Review, International Journal of Occupational Safety and Ergonomics, 19:2, 195-202.
Brian Kappus and Ben Long, Spatiotemporal Modulation for Mid-Air Haptic Feedback from an Ultrasonic Phased Array, ICSV25, Hiroshima, Jul. 8-12, 2018, 6 pages.
Bybi, A., Grondel, S., Mzerd, A., Granger, C., Garoum, M., & Assaad, J. (2019). Investigation of cross-coupling in piezoelectric transducer arrays and correction. International Journal of Engineering and Technology Innovation, 9(4), 287.
Canada Application 2,909,804 Office Action dated Oct. 18, 2019, 4 pages.
Cappellari et al., "Identifying Electromyography Sensor Placement using Dense Neural Networks." In DATA, pp. 130-141. 2018. (Year: 2018).
Casper et al., Realtime Control of Multiple-focus Phased Array Heating Patterns Based on Noninvasive Ultrasound Thermography, IEEE Trans Biomed Eng. Jan. 2012; 59(1): 95-105.
Certon, D., Felix, N., Hue, P. T. H., Patat, F., & Lethiecq, M. (Oct. 1999). Evaluation of laser probe performances for measuring cross-coupling in 1-3 piezocomposite arrays. In 1999 IEEE Ultrasonics Symposium. Proceedings. International Symposium (Cat. No. 99CH37027) (vol. 2, pp. 1091-1094).
Certon, D., Felix, N., Lacaze, E., Teston, F., & Patat, F. (2001). Investigation of cross-coupling in 1-3 piezocomposite arrays. IEEE transactions on ultrasonics, ferroelectrics, and frequency control, 48(1), 85-92.
Chang Suk Lee et al., An electrically switchable visible to infra-red dual frequency cholesteric liquid crystal light shutter, J. Mater. Chem. C, 2018, 6, 4243 (7 pages).
Christoper M. Bishop, Pattern Recognition and Machine Learning, 2006, pp. 1-758.
Colgan, A., "How Does the Leap Motion Controller Work?" Leap Motion, Aug. 9, 2014, 10 pages.
Communication Pursuant to Article 94(3) EPC for EP 19723179.8 (Feb. 15, 2022), 10 pages.
Corrected Notice of Allowability dated Aug. 9, 2021 for U.S. Appl. No. 15/396,851 (pp. 1-6).
Corrected Notice of Allowability dated Jan. 14, 2021 for U.S. Appl. No. 15/897,804 (pp. 1-2).
Corrected Notice of Allowability dated Jun. 21, 2019 for U.S. Appl. No. 15/966,213 (2 pages).
Corrected Notice of Allowability dated Nov. 24, 2021 for U.S. Appl. No. 16/600,500 (pp. 1-5).
Corrected Notice of Allowability dated Oct. 31, 2019 for U.S. Appl. No. 15/623,516 (pp. 1-2).
Damn Geeky, "Virtual projection keyboard technology with haptic feedback on palm of your hand," May 30, 2013, 4 pages.
David Joseph Tan et al., Fits like a Glove: Rapid and Reliable Hand Shape Personalization, 2016 IEEE Conference on Computer Vision and Pattern Recognition, pp. 5610-5619.
Definition of "Interferometry"according to Wikipedia, 25 pages., Retrieved Nov. 2018.
Definition of "Multilateration" according to Wikipedia, 7 pages., Retrieved Nov. 2018.
Definition of "Trilateration"according to Wikipedia, 2 pages., Retrieved Nov. 2018.
Der et al., Inverse kinematics for reduced deformable models. ACM Transactions on graphics (TOG) 25, No. 3 (2006): 1174-1179. (Year: 2006).
DeSilets, C. S. (1978). Transducer arrays suitable for acoustic imaging (No. GL-2833). Stanford Univ CA Edward L Ginzton Lab of Physics. 5 pages.
Diederik P. Kingma et al., Adam: A Method for Stochastic Optimization, Jan. 30, 2017, pp. 1-15.
Duka, "Neural network based inverse kinematics solution for trajectory tracking of a robotic arm." Procedia Technology 12 (2014) 20-27. (Year: 2014).
E. Bok, Metasurface for Water-to-Air Sound Transmission, Physical Review Letters 120, 044302 (2018) (6 pages).
E.S. Ebbini et al. (1991), A spherical-section ultrasound phased array applicator for deep localized hyperthermia, Biomedical Engineering, IEEE Transactions on (vol. 38 Issue: 7), pp. 634-643.
EPO 21186570.4 Extended Search Report dated Oct. 29, 2021, 10 pages.
EPO Application 18 725 358.8 Examination Report Dated Sep. 22, 2021, 15 pages.
EPO Communication for Application 18 811 906.9 (Nov. 29, 2021) (15 pages).
EPO Examination Report 17 748 4656.4 (Jan. 12, 2021) (16 pages).
Notice of Allowance dated Apr. 20, 2021 for U.S. Appl. No. 16/563,608 (pp. 1-5).
Notice of Allowance dated Apr. 22, 2020 for U.S. Appl. No. 15/671,107 (pp. 1-5).
Notice of Allowance dated Dec. 19, 2018 for U.S. Appl. No. 15/665,629 (pp. 1-9).
Notice of Allowance dated Dec. 21, 2018 for U.S. Appl. No. 15/983,864 (pp. 1-7).
Notice of Allowance dated Feb. 10, 2020, for U.S. Appl. No. 16/160,862 (pp. 1-9).
Notice of Allowance dated Feb. 7, 2019 for U.S. Appl. No. 15/851,214 (pp. 1-7).
Notice of Allowance dated Jul. 22, 2021 for U.S. Appl. No. 16/600,500 (pp. 1-9).
Notice of Allowance dated Jul. 31, 2019 for U.S. Appl. No. 15/851,214 (pp. 1-9).
Notice of Allowance dated Jul. 31, 2019 for U.S. Appl. No. 16/296,127 (pp. 1-9).
Notice of Allowance dated Jun. 10, 2021 for U.S. Appl. No. 17/092,333 (pp. 1-9).
Notice of Allowance dated Jun. 17, 2020 for U.S. Appl. No. 15/210,661 (pp. 1-9).
Notice of Allowance dated Jun. 25, 2021 for U.S. Appl. No. 15/396,851 (pp. 1-10).
Notice of Allowance dated May 30, 2019 for U.S. Appl. No. 15/966,213 (pp. 1-9).
Notice of Allowance dated Nov. 5, 2021 for U.S. Appl. No. 16/899,720 (pp. 1-9).
Notice of Allowance dated Oct. 1, 2020 for U.S. Appl. No. 15/897,804 (pp. 1-9).
Notice of Allowance dated Oct. 16, 2020 for U.S. Appl. No. 16/159,695 (pp. 1-7).
Notice of Allowance dated Oct. 30, 2020 for U.S. Appl. No. 15/839,184 (pp. 1-9).

(56) References Cited

OTHER PUBLICATIONS

Notice of Allowance dated Oct. 6, 2020 for U.S. Appl. No. 16/699,629 (pp. 1-8).
Notice of Allowance dated Sep. 30, 2020 for U.S. Appl. No. 16/401,148 (pp. 1-10).
Notice of Allowance in U.S. Appl. No. 15/210,661 dated Jun. 17, 2020 (22 pages).
Nuttall, A. (Feb. 1981). Some windows with very good sidelobe behavior. IEEE Transactions on Acoustics, Speech, and Signal Processing.
Obrist et al., Emotions Mediated Through Mid-Air Haptics, CHI 2015, Apr. 18-23, 2015, Seoul, Republic of Korea. (10 pages).
Obrist et al., Talking about Tactile Experiences, CHI 2013, Apr. 27-May 2, 2013 (10 pages).
Office Action (Ex Parte Quayle Action) dated Jan. 6, 2023 for U.S. Appl. No. 17/195,795 (pp. 1-6).
Office Action (Ex Parte Quayle Action) dated Jul. 20, 2023 for U.S. Appl. No. 16/843,281 (pp. 1-15).
Office Action (Final Rejection) dated Jan. 9, 2023 for U.S. Appl. No. 16/144,474 (pp. 1-16).
Office Action (Final Rejection) dated Mar. 14, 2022 for U.S. Appl. No. 16/564,016 (pp. 1-12).
Office Action (Final Rejection) dated Mar. 21, 2023 for U.S. Appl. No. 16/995,819 (pp. 1-7).
Office Action (Final Rejection) dated Jul. 25, 2023 for U.S. Appl. No. 17/454,823 (pp. 1-17).
Office Action (Final Rejection) dated Sep. 16, 2022 for U.S. Appl. No. 16/404,660 (pp. 1-6).
Office Action (Final Rejection) dated Nov. 18, 2022 for U.S. Appl. No. 16/228,767 (pp. 1-27).
Office Action (Final Rejection) dated Nov. 18, 2022 for U.S. Appl. No. 17/068,831 (pp. 1-9).
Office Action (Final Rejection) dated Dec. 8, 2022 for U.S. Appl. No. 16/229,091 (pp. 1-9).
Office Action (Final Rejection) dated Dec. 15, 2022 for U.S. Appl. No. 16/843,281 (pp. 1-25).
Office Action (Non-Final Rejection) dated Jan. 21, 2022 for U.S. Appl. No. 17/068,834 (pp. 1-12).
Office Action (Non-Final Rejection) dated Jan. 24, 2022 for U.S. Appl. No. 16/228,767 (pp. 1-22).
Office Action (Non-Final Rejection) dated Mar. 1, 2023 for U.S. Appl. No. 16/564,016 (pp. 1-10).
Office Action (Non-Final Rejection) dated Mar. 4, 2022 for U.S. Appl. No. 16/404,660 (pp. 1-5).
Office Action (Non-Final Rejection) dated Mar. 15, 2022 for U.S. Appl. No. 16/144,474 (pp. 1-13).
Office Action (Non-Final Rejection) dated Mar. 22, 2023 for U.S. Appl. No. 17/354,636 (pp. 1-5).
Office Action (Non-Final Rejection) dated Apr. 1, 2022 for U.S. Appl. No. 16/229,091 (pp. 1-10).
Office Action (Non-Final Rejection) dated Apr. 19, 2023 for U.S. Appl. No. 18/066,267 (pp. 1-11).
Office Action (Non-Final Rejection) dated Apr. 27, 2023 for U.S. Appl. No. 16/229,091 (pp. 1-5).
Office Action (Non-Final Rejection) dated May 2, 2022 for U.S. Appl. No. 17/068,831 (pp. 1-10).
Office Action (Non-Final Rejection) dated May 8, 2023 for U.S. Appl. No. 18/065,603 (pp. 1-17).
Office Action (Non-Final Rejection) dated May 10, 2023 for U.S. Appl. No. 17/477,536 (pp. 1-13).
Office Action (Non-Final Rejection) dated May 25, 2022 for U.S. Appl. No. 16/843,281 (pp. 1-28).
Office Action (Non-Final Rejection) dated Jun. 9, 2022 for U.S. Appl. No. 17/080,840 (pp. 1-9).
Office Action (Non-Final Rejection) dated Jun. 27, 2022 for U.S. Appl. No. 16/198,959 (pp. 1-17).
Office Action (Non-Final Rejection) dated Jun. 27, 2022 for U.S. Appl. No. 16/734,479 (pp. 1-13).
Yoshino, K. and Shinoda, H. (2013), "Visio Acoustic Screen for Contactless Touch Interface with Tactile Sensation", University of Tokyo (5 pages).
Zeng, Wejun, "Microsoft Kinect Sensor and Its Effect," IEEE Multimedia, Apr.-Jun. 2012, 7 pages.
EPO Examination Search Report 17 702 910.5 (Jun. 23, 2021) 10 pages.
EPO ISR and WO for PCT/GB2022/050204 (Apr. 7, 2022) (15 pages).
EPO Office Action for EP16708440.9 dated Sep. 12, 2018 (7 pages).
EPSRC Grant summary EP/J004448/1 (2011) (1 page).
Eric Tzeng et al., Adversarial Discriminative Domain Adaptation, Feb. 17, 2017, pp. 1-10.
European Office Action for Application No. EP16750992.6, dated Oct. 2, 2019, 3 pages.
Ex Parte Quayle Action dated Dec. 28, 2018 for U.S. Appl. No. 15/966,213 (pp. 1-7).
Extended European Search Report for Application No. EP19169929.7, dated Aug. 6, 2019, 7 pages.
Freeman et al., Tactile Feedback for Above-Device Gesture Interfaces: Adding Touch to Touchless Interactions ICMI'14, Nov. 12-16, 2014, Istanbul, Turkey (8 pages).
Gareth Young et al.. Designing Mid-Air Haptic Gesture Controlled User Interfaces for Cars, PACM on Human-Computer Interactions, Jun. 2020 (24 pages).
Gavrilov L R et al.(2000) "A theoretical assessment of the relative performance of spherical phased arrays for ultrasound surgery" Ultrasonics, Ferroelectrics, and Frequency Control, IEEE Transactions on (vol. 47, Issue: 1), pp. 125-139.
Gavrilov, L.R. (2008) "The Possibility of Generating Focal Regions of Complex Configurations in Application to the Problems of Stimulation of Human Receptor Structures by Focused Ultrasound" Acoustical Physics, vol. 54, No. 2, pp. 269-278.
Georgiou et al., Haptic In-Vehicle Gesture Controls, Adjunct Proceedings of the 9th International ACM Conference on Automotive User Interfaces and Interactive Vehicular Applications (AutomotiveUI '17), Sep. 24-27, 2017 (6 pages).
GitHub—danfis/libccd: Library for collision detection between two convex shapes, Mar. 26, 2020, pp. 1-6.
GitHub—IntelRealSense/hand_tracking_samples: researc codebase for depth-based hand pose estimation using dynamics based tracking and CNNs, Mar. 26, 2020, 3 pages.
Gokturk, et al., "A Time-of-Flight Depth Sensor-System Description, Issues and Solutions," Published in: 2004 Conference on Computer Vision and Pattern Recognition Workshop, Date of Conference: Jun. 27-Jul. 2, 2004, 9 pages.
Guez, "Solution to the inverse kinematic problem in robotics by neural networks." In Proceedings of the 2nd International Conference on Neural Networks, 1988. San Diego, California. (Year: 1988) 8 pages.
Hasegawa, K. and Shinoda, H. (2013) "Aerial Display of Vibrotactile Sensation with High Spatial-Temporal Resolution sing Large Aperture Airbourne Ultrasound Phased Array", University of Tokyo (6 pages).
Henneberg, J., Gerlach, A., Storck, H., Cebulla, H., & Marburg, S. (2018). Reducing mechanical cross-coupling in phased array transducers using stop band material as backing. Journal of Sound and Vibration, 424, 352-364.
Henrik Bruus, Acoustofluidics 2: Perturbation theory and ultrasound resonance modes, Lab Chip, 2012, 12, 20-28.
Hilleges et al. Interactions in the air: adding further depth to interactive tabletops, UIST '09: Proceedings of the 22nd annual ACM symposium on User interface software and technologyOctober 2009 pp. 139-148.
Hoshi et al.,Tactile Presentation by Airborne Ultrasonic Oscillator Array, Proceedings of Robotics and Mechatronics Lecture 2009, Japan Society of Mechanical Engineers; May 24, 2009 (5 pages).
Hoshi T et al., "Noncontact Tactile Display Based on Radiation Pressure of Airborne Ultrasound", IEEE Transactions on Haptics, IEEE, USA, (Jul. 1, 2010), vol. 3, No. 3, ISSN 1939-1412, pp. 155-165.

(56) References Cited

OTHER PUBLICATIONS

Hoshi, T., Development of Aerial-Input and Aerial-Tactile-Feedback System, IEEE World Haptics Conference 2011, p. 569-573.
Hoshi, T., Handwriting Transmission System Using Noncontact Tactile Display, IEEE Haptics Symposium 2012 pp. 399-401.
Hoshi, T., Non-contact Tactile Sensation Synthesized by Ultrasound Transducers, Third Joint Euro haptics Conference and Symposium on Haptic Interfaces for Virtual Environment and Teleoperator Systems 2009 (5 pages).
Hoshi, T., Touchable Holography, SIGGRAPH 2009, New Orleans, Louisiana, Aug. 3-7, 2009. (1 page).
https://radiopaedia.org/articles/physical-principles-of-ultrasound-1?lang=GB (Accessed May 29, 2022).
Hua J, Qin H., Haptics-based dynamic implicit solid modeling, IEEE Trans Vis Comput Graph. Sep.-Oct. 2004;10 (5):574-86.
Hyunjae Gil, Whiskers: Exploring the Use of Ultrasonic Haptic Cues on the Face, CHI 2018, Apr. 21-26, 2018, Montréal, QC, Canada.
Iddan, et al., "3D Imaging in the Studio (And Elsewhwere . . . " Apr. 2001, 3DV systems Ltd., Yokneam, Isreal, www.3dvsystems.com.il, 9 pages.
Imaginary Phone: Learning Imaginary Interfaces by Transferring Spatial Memory From a Familiar Device Sean Gustafson, Christian Holz and Patrick Baudisch. UIST 2011. (10 pages).
IN 202047026493 Office Action dated Mar. 8, 2022, 6 pages.
India Morrison, The skin as a social organ, Exp Brain Res (2010) 204:305-314.
International Preliminary Report on Patentability and Written Opinion issued in corresponding PCT/US2017/035009, dated Dec. 4, 2018, 8 pages.
International Preliminary Report on Patentability for Application No. PCT/EP2017/069569 dated Feb. 5, 2019, 11 pages.
International Search Report and Written Opinion for App. No. PCT/GB2021/051590, dated Nov. 11, 2021, 20 pages.
International Search Report and Written Opinion for Application No. PCT/GB2018/053738, date of mailing Apr. 11, 2019, 14 pages.
International Search Report and Written Opinion for Application No. PCT/GB2018/053739, date of mailing Jun. 4, 2019, 16 pages.
International Search Report and Written Opinion for Application No. PCT/GB2019/050969, date of mailing Jun. 13, 2019, 15 pages.
International Search Report and Written Opinion for Application No. PCT/GB2019/051223, date of mailing Aug. 8, 2019, 15 pages.
International Search Report and Written Opinion for Application No. PCT/GB2019/052510, date of mailing Jan. 14, 2020, 25 pages.
Invitation to Pay Additional Fees for PCT/GB2022/051821 (Oct. 20, 2022), 15 pages.
ISR & WO for PCT/GB2020/052545 (Jan. 27, 2021) 14 pages.
ISR & WO For PCT/GB2021/052946, 15 pages.
ISR & WO for PCT/GB2022/051388 (Aug. 30, 2022) (15 pages).
ISR and WO for PCT/GB2020/050013 (Jul. 13, 2020) (20 pages).
ISR and WO for PCT/GB2020/050926 (Jun. 2, 2020) (16 pages).
ISR and WO for PCT/GB2020/052544 (Dec. 18, 2020) (14 pages).
ISR and WO for PCT/GB2020/052829 (Feb. 10, 2021) (15 pages).
ISR and WO for PCT/GB2021/052415 (Dec. 22, 2021) (16 pages).
ISR and WO for PCT/GB2023/050001 (May 24, 2023) (20 pages).
ISR for PCT/GB2020/052546 (Feb. 23, 2021) (14 pages).
ISR for PCT/GB2020/053373 (Mar. 26, 2021) (16 pages).
Iwamoto et al. (2008), Non-contact Method for Producing Tactile Sensation Using Airborne Ultrasound, EuroHaptics, pp. 504-513.
Iwamoto et al., Airborne Ultrasound Tactile Display: Supplement, The University of Tokyo 2008 (2 pages).
Iwamoto T et al., "Two-dimensional Scanning Tactile Display using Ultrasound Radiation Pressure", Haptic Interfaces for Virtual Environment and Teleoperator Systems, 2006 14th Symposium on Alexandria, VA, USA Mar. 25-26, 2006, Piscataway, NJ, USA, IEEE, (Mar. 25, 2006), ISBN 978-1-4244-0226-7, pp. 57-61.
Jager et al., "Air-Coupled 40-KHZ Ultrasonic 2D-Phased Array Based on a 3D-Printed Waveguide Structure", 2017 IEEE, 4 pages.
Japanese Office Action (with English language translation) for Application No. 2017-514569, dated Mar. 31, 2019, 10 pages.
Jonaschatel-Goldman, Touch increases autonomic coupling between romantic partners, Frontiers in Behavioral Neuroscience Mar. 2014, vol. 8, Article 95.
Jonathan Taylor et al., Articulated Distance Fields for Ultra-Fast Tracking of Hands Interacting, ACM Transactions on Graphics, vol. 36, No. 4, Article 244, Publication Date: Nov. 2017, pp. 1-12.
Jonathan Taylor et al., Efficient and Precise Interactive Hand Tracking Through Joint, Continuous Optimization of Pose and Correspondences, SIGGRAPH '16 Technical Paper, Jul. 24-28, 2016, Anaheim, CA, ISBN: 978-1-4503-4279-87/16/07, pp. 1-12.
Jonathan Tompson et al., Real-Time Continuous Pose Recovery of Human Hands Using Convolutional Networks, ACM Trans. Graph. 33, 5, Article 169, Aug. 2014, pp. 1-10.
JP Office Action for JP 2020-534355 (Dec. 6, 2022) (8 pages).
K. Jia, Dynamic properties of micro-particles in ultrasonic transportation using phase-controlled standing waves, J. Applied Physics 116, n. 16 (2014) (12 pages).
Kai Tsumoto, Presentation of Tactile Pleasantness Using Airborne Ultrasound, 2021 IEEE World Haptics Conference (WHC) Jul. 6-9, 2021. Montreal, Canada.
Kaiming He et al., Deep Residual Learning for Image Recognition, http://image-net.org/challenges/LSVRC/2015/ and http://mscoco.org/dataset/#detections-challenge2015, Dec. 10, 2015, pp. 1-12.
Kamakura, T. and Aoki, K. (2006) "A Highly Directional Audio System using a Parametric Array in Air" WESPAC IX 2006 (8 pages).
Keisuke Hasegawa, Electronically steerable ultrasound-driven long narrow air stream, Applied Physics Letters 111, 064104 (2017).
Keisuke Hasegawa, Midair Ultrasound Fragrance Rendering, IEEE Transactions On Visualization and Computer Graphics, vol. 24, No. 4, Apr. 2018 1477.
Keisuke Hasegawa,, Curved acceleration path of ultrasound-driven air flow, J. Appl. Phys. 125, 054902 (2019).
Ken Wada, Ring Buffer Basics (2013) 6 pages.
Kolb, et al., "Time-of-Flight Cameras in Computer Graphics," Computer Graphics forum, vol. 29 (2010), No. 1, pp. 141-159.
Konstantinos Bousmalis et al., Domain Separation Networks, 29th Conference on Neural Information Processing Systems (NIPS 2016), Barcelona, Spain. Aug. 22, 2016, pp. 1-15.
Krim, et al., "Two Decades of Array Signal Processing Research—The Parametric Approach", IEEE Signal Processing Magazine, Jul. 1996, pp. 67-94.
Lang, Robert, "3D Time-of-Flight Distance Measurement with Custom Solid-State Image Sensors in CMOS/CCD—Technology", A dissertation submitted to Department of EE and CS at Univ. of Siegen, dated Jun. 28, 2000, 223 pages.
Large et al.,Feel the noise: Mid-air ultrasound haptics as a novel human-vehicle interaction paradigm, Applied Ergonomics (2019) (10 pages).
Li, Larry, "Time-of-Flight Camera—An Introduction," Texas Instruments, Technical White Paper, SLOA190B—Jan. 2014 Revised May 2014, 10 pages.
Light, E.D., Progress in Two Dimensional Arrays for Real Time Volumetric Imaging, 1998 (17 pages).
Line S Loken, Coding of pleasant touch by unmyelinated afferents in humans, Nature Neuroscience vol. 12 [ No. 5 [ May 2009 547.
M. Barmatz et al., "Acoustic radiation potential on a sphere in plane, cylindrical, and spherical standing wave fields", The Journal of the Acoustical Society of America, New York, NY, US, (19850301), vol. 77, No. 3, pp. 928-945, XP055389249.
M. Toda, New Type of Matching Layer for Air-Coupled Ultrasonic Transducers, IEEE Transactions on Ultrasonics, Ferroelecthcs, and Frequency Control, vol. 49, No. 7, Jul. 2002 (8 pages).
Mahboob, "Artificial neural networks for learning inverse kinematics of humanoid robot arms." MS Thesis, 2015. (Year: 2015) 95 pages.
Mahdi Rad et al., Feature Mapping for Learning Fast and Accurate 3D Pose Inference from Synthetic Images, Mar. 26, 2018, pp. 1-14.

(56) References Cited

OTHER PUBLICATIONS

Marco A B Andrade et al., "Matrix method for acoustic levitation simulation", IEEE Transactions on Ultrasonics, Ferroelectrics and Frequency Control, IEEE, US, (Aug. 1, 2011), vol. 58, No. 8, ISSN 0885-3010, pp. 1674-1683.
Mariana von Mohr, The soothing function of touch: affective touch reduces feelings of social exclusion, Scientific Reports, 7: 13516, Oct. 18, 2017.
Marin, About LibHand, LibHand—A Hand Articulation Library, www.libhand.org/index.html, Mar. 26, 2020, pp. 1-2; www.libhand.org/download.html, 1 page; www.libhand.org/examples.html, pp. 1-2.
Markus Oberweger et al., DeepPrior++: Improving Fast and Accurate 3D Hand Pose Estimation, Aug. 28, 2017, pp. 1-10.
Markus Oberweger et al., Hands Deep in Deep Learning for Hand Pose Estimation, Dec. 2, 2016, pp. 1-10.
Marshall, M., Carter, T., Alexander, J., & Subramanian, S. (2012). Ultratangibles: creating movable tangible objects on interactive tables. In Proceedings of the 2012 ACM annual conference on Human Factors in Computing Systems, (pp. 2185-2188).
Marzo et al., Holographic acoustic elements for manipulation of levitated objects, Nature Communications DOI: 10.1038/ncomms9661 (2015) (7 pages).
Meijster, A., et al., "A General Algorithm for Computing Distance Transforms in Linear Time," Mathematical Morphology and its Applications to Image and Signal Processing, 2002, pp. 331-340.
Mingzhu Lu et al. (2006) Design and experiment of 256-element ultrasound phased array for noninvasive focused ultrasound surgery, Ultrasonics, vol. 44, Supplement, Dec. 22, 2006, pp. e325-e330.
Mitsuru Nakajima, Remotely Displaying Cooling Sensation via Ultrasound-Driven Air Flow, Haptics Symposium 2018, San Francisco, USA p. 340.
Mohamed Yacine Tsalamlal, Affective Communication through Air Jet Stimulation: Evidence from Event-Related Potentials, International Journal of Human-Computer Interaction 2018.
Mohamed Yacine Tsalamlal, Non-Intrusive Haptic Interfaces: State-of-the Art Survey, HAID 2013, LNCS 7989, pp. 1-9, 2013.
Montenegro et al., "Neural Network as an Alternative to the Jacobian for Iterative Solution to Inverse Kinematics," 2018 Latin American Robotic Symposium, 2018 Brazilian Symposium on Robotics (SBR) and 2018 Workshop on Robotics in Education (WRE) João Pessoa, Brazil, 2018, pp. 333-338 (Year: 2018).
Mueller, GANerated Hands for Real-Time 3D Hand Tracking from Monocular RGB, Eye in-Painting with Exemplar Generative Adversarial Networks, pp. 49-59 (Jun. 1, 2018).
Nina Gaissert, Christian Wallraven, and Heinrich H. Bulthoff, "Visual and Haptic Perceptual Spaces Show High Similarity in Humans", published to Journal of Vision in 2010, available at http://www.journalofvision.org/content/10/11/2 and retrieved on Apr. 22, 2020 ( Year: 2010), 20 pages.
Notice of Allowance dated Feb. 23, 2023 for U.S. Appl. No. 18/060,556 (pp. 1-10).
"Flexible piezoelectric transducer for ultrasonic inspection of non-planar components." Ultrasonics 48.5 (2008): 367-375.
Andre J. Duerinckx, Matched gaussian apodization of pulsed acoustic phased arrays, Ultrasonic Imaging, vol. 2, Issue 4, Oct. 1980, pp. 338-369.
EPO Examination Report for EP19769198.3 (Jul. 11, 2023) 9 pages.
Examination Report for EP 17 826 539.3 (Aug. 2, 2023) (5 pages).
First Examination report for ndian Patent Application No. 202247024128 (Aug. 11, 2023) (6 pages).
IL OA for IL 278402 (Nov. 29, 2023) 4 pages.
Inoue, A Pinchable Aerial Virtual Sphere by Acoustic Ultrasound Stationary Wave, IEEE (Year: 2014) 4 pages.
ISR and WO for PCT/GB2023/052122 (Oct. 18, 2023) 13 pages.
ISR and WO for PCT/GB2023/052612 (Mar. 7, 2024) 18 pages.
Ochiai, Cross-Field Aerial Haptics: Rendering Haptic Feedback in Air with Light and Acoustic Fields, CHI (Year: 2016) 10 pages.
Office Action (Ex Parte Quayle Action) dated Sep. 18, 2023 for U.S. Appl. No. 18/066,267 (pp. 1-6).
Office Action (Final Rejection) dated Aug. 30, 2023 for U.S. Appl. No. 16/564,016 (pp. 1-15).
Office Action (Non-Final Rejection) dated Jan. 19, 2024 for U.S. Appl. No. 18/305,354 (pp. 1-4).
Office Action (Non-Final Rejection) dated Feb. 1, 2024 for U.S. Appl. No. 17/835,411 (pp. 1-7).
Office Action (Non-Final Rejection) dated Mar. 14, 2024 for U.S. Appl. No. 18/188,584 (pp. 1-5).
Office Action (Non-Final Rejection) dated Mar. 28, 2024 for U.S. Appl. No. 18/359,951 (pp. 1-5).
Office Action (Non-Final Rejection) dated Sep. 7, 2023 for U.S. Appl. No. 16/144,474 (pp. 1-16).
Office Action (Non-Final Rejection) dated Sep. 28, 2023 for U.S. Appl. No. 16/995,819 (pp. 1-8).
Office Action (Non-Final Rejection) dated Oct. 3, 2023 for U.S. Appl. No. 18/303,386 (pp. 1-18).
Office Action (Notice of Allowance and Fees Due (PTOL-85)) dated Jan. 31, 2024 for U.S. Appl. No. 18/352,981 (pp. 1-6).
Office Action (Notice of Allowance and Fees Due (PTOL-85)) dated Aug. 8, 2023 for U.S. Appl. No. 17/645,305 (pp. 1-8).
Office Action (Notice of Allowance and Fees Due (PTOL-85)) dated Sep. 11, 2023 for U.S. Appl. No. 18/065,603 (pp. 1-11).
Office Action (Notice of Allowance and Fees Due (PTOL-85)) dated Oct. 12, 2023 for U.S. Appl. No. 18/066,267 (pp. 1-5).
Office Action (Notice of Allowance and Fees Due (PTOL-85)) dated Oct. 18, 2023 for U.S. Appl. No. 17/477,536 (pp. 1-8).
Schiefler, Generation and Analysis of Ultrasound Images Using Plane Wave and Sparse Arrays Techniques, Sensors (Year: 2018) 23 pages.
Smart Interface: Piezo Components with Flexible Printed Circuit Boards, www.physikinstrumente.co.uk/en/products/piezo-ceramic-components-transducers-for-oems/smart-interface/ (accessed Sep. 11, 2023) 5 pages.
Search report and Written Opinion of ISA for PCT/GB2015/050421 dated Jul. 8, 2016 (15 pages).
Search report and Written Opinion of ISA for PCT/GB2017/050012 dated Jun. 8, 2017. (18 pages).
Search Report by EPO for EP 17748466 dated Jan. 13, 2021 (16 pages).
Search Report for GB1308274.8 dated Nov. 11, 2013. (2 pages).
Search Report for GB1415923.0 dated Mar. 11, 2015. (1 page).
Search Report for PCT/GB/2017/053729 dated Mar. 15, 2018 (16 pages).
Search Report for PCT/GB/2017/053880 dated Mar. 21, 2018. (13 pages).
Search report for PCT/GB2014/051319 dated Dec. 8, 2014 (4 pages).
Search report for PCT/GB2015/052507 dated Mar. 11, 2020 (19 pages).
Search report for PCT/GB2015/052578 dated Oct. 26, 2015 (12 pages).
Search report for PCT/GB2015/052916 dated Feb. 26, 2020 (18 pages).
Search Report for PCT/GB2017/052332 dated Oct. 10, 2017 (12 pages).
Search report for PCT/GB2018/051061 dated Sep. 26, 2018 (17 pages).
Search report for PCT/US2018/028966 dated Jul. 13, 2018 (43 pages).
Seo et al., "Improved numerical inverse kinematics for human pose estimation," Opt. Eng. 50(3 037001 (Mar. 1, 2011) https://doi.org/10.1117/1.3549255 (Year: 2011).
Sergey Ioffe et al., Batch Normalization: Accelerating Deep Network Training by Reducing Internal Covariat Shift, Mar. 2, 2015, pp. 1-11.
Seungryul, Pushing the Envelope for RGB-based Dense 3D Hand Pose Estimation for RGB-based Desne 3D Hand Pose Estimation via Neural Rendering, arXiv:1904.04196v2 [cs.CV] Apr. 9, 2019 (5 pages).
Shakeri, G., Williamson, J. H. and Brewster, S. (2018) May the Force Be with You: Ultrasound Haptic Feedback for Mid-Air Gesture Interaction in Cars. In: 10th International ACM Conference

(56) References Cited

OTHER PUBLICATIONS on Automotive User Interfaces and Interactive Vehicular Applications (AutomotiveUI 2018) (11 pages).
Shanxin Yuan et al., BigHand2.2M Bechmark: Hand Pose Dataset and State of the Art Analysis, Dec. 9, 2017, pp. 1-9.
Shome Subhra Das, Detectioin of Self Intersection in Synthetic Hand Pose Generators, 2017 Fifteenth IAPR International Conference on Machine Vision Applications (MVA), Nagoya University, Nagoya, Japan, May 8-12, 2017, pp. 354-357.
Sixth Sense webpage, http://www.pranavmistry.com/projects/sixthsense/ Accessed Nov. 30, 2018, 7 pages.
Stan Melax et al., Dynamics Based 3D Skeletal Hand Tracking, May 22, 2017, pp. 1-8.
Stanley J. Bolanowski, Hairy Skin: Psychophysical Channels and Their Physiological Substrates, Somatosensory and Motor Research, vol. 11. No. 3, 1994, pp. 279-290.
Stefan G. Lechner, Hairy Sensation, Physiology 28: 142-150, 2013.
Steve Guest et al., "Audiotactile interactions in roughness perception", Exp. Brain Res (2002) 146:161-171, DOI 10.1007/s00221-002-1164-z, Accepted: May 16, 2002/Published online: Jul. 26, 2002, Springer-Verlag 2002, (11 pages).
Supplemental Notice of Allowability dated Jul. 28, 2021 for U.S. Appl. No. 16/563,608 (pp. 1-2).
Supplemental Notice of Allowability dated Jul. 28, 2021 for U.S. Appl. No. 17/092,333 (pp. 1-2).
Sylvia Gebhardt, Ultrasonic Transducer Arrays for Particle Manipulation (date unknown) (2 pages).
Takaaki Kamigaki, Noncontact Thermal and Vibrotactile Display Using Focused Airborne Ultrasound, EuroHaptics 2020, LNCS 12272, pp. 271-278, 2020.
Takahashi Dean: "Ultrahaptics shows off sense of touch in virtual reality", Dec. 10, 2016 (Dec. 10, 2016), XP055556416, Retrieved from the Internet: URL: https://venturebeat.com/2016/12/10/ultrahaptics-shows-off-sense-of-touch-in-virtual-reality/ [retrieved on Feb. 13, 2019] 4 pages.
Takahashi, M. et al., Large Aperture Airborne Ultrasound Tactile Display Using Distributed Array Units, SICE Annual Conference 2010 p. 359-62.
Takayuki et al., "Noncontact Tactile Display Based on Radiation Pressure of Airborne Ultrasound" IEEE Transactions on Haptics vol. 3, No. 3, p. 165 (2010).
Teixeira, et al., "A brief introduction to Microsoft's Kinect Sensor," Kinect, 26 pages, retrieved Nov. 2018.
Toby Sharp et al., Accurate, Robust, and Flexible Real-time Hand Tracking, CHI '15, Apr. 18-23, 2015, Seoul, Republic of Korea, ACM 978-1-4503-3145-6/15/04, pp. 1-10.
Tom Carter et al., "UltraHaptics: Multi-Point Mid-Air Haptic Feedback for Touch Surfaces", Proceedings of the 26th Annual ACM Symposium on User Interface Software and Technology, UIST '13, New York, New York, USA, (Jan. 1, 2013), ISBN 978-1-45-032268-3, pp. 505-514.
Tom Nelligan and Dan Kass, Intro to Ultrasonic Phased Array (date unknown) (8 pages).
Tomoo Kamakura, Acoustic streaming induced in focused Gaussian beams, J. Acoust. Soc. Am. 97 (5), Pt. 1, May 1995 p. 2740.
Uta Sailer, How Sensory and Affective Attributes Describe Touch Targeting C-Tactile Fibers, Experimental Psychology (2020), 67(4), 224-236.
Vincent Lepetit et al., Model Based Augmentation and Testing of an Annotated Hand Pose Dataset, ResearchGate, https://www.researchgate.net/publication/307910344, Sep. 2016, 13 pages.
Walter, S., Nieweglowski, K., Rebenklau, L., Wolter, K. J., Lamek, B., Schubert, F., . . . & Meyendorf, N. (May 2008). Manufacturing and electrical interconnection of piezoelectric 1-3 composite materials for phased array ultrasonic transducers. In 2008 31st International Spring Seminar on Electronics Technology (pp. 255-260).
Wang et al., Few-shot adaptive faster r-cnn. In Proceedings of the IEEE/CVF Conference on Computer Vision and Pattern Recognition, pp. 7173-7182. 2019. (Year: 2019).
Wang et al., Device-Free Gesture Tracking Using Acoustic Signals, ACM MobiCom '16, pp. 82-94 (13 pages).
Wilson et al., Perception of Ultrasonic Haptic Feedback on the Hand: Localisation and Apparent Motion, CHI 2014, Apr. 26-May 1, 2014, Toronto, Ontario, Canada. (10 pages).
Wooh et al., "Optimum beam steering of linear phased arays," Wave Motion 29 (1999) pp. 245-265, 21 pages.
Xin Cheng et al., "Computation of the acoustic radiation force on a sphere based on the 3-D FDTD method", Piezoelectricity, Acoustic Waves and Device Applications (SPAWDA), 2010 Symposium on, IEEE, (20101210), ISBN 978-1-4244-9822-2, pp. 236-239.
Xu Hongyi et al., "6-DoF Haptic Rendering Using Continuous Collision Detection between Points and Signed Distance Fields", IEEE Transactions on Haptics, IEEE, USA, vol. 10, No. 2, ISSN 1939-1412, (Sep. 27, 2016), pp. 151-161, (Jun. 16, 2017).
Yang Ling et al, "Phase-coded approach for controllable generation of acoustical vortices", Journal of Applied Physics, American Institute of Physics, US, vol. 113, No. 15, ISSN 0021-8979, (Apr. 21, 2013), pp. 154904-154904.
Yarin Gal et al., Dropout as a Bayesian Approximation: Representing Model Uncertainty in Deep Learning, Oct. 4, 2016, pp. 1-12, Proceedings of the 33rd International Conference on Machine Learning, New York, NY, USA, 2016, JMLR: W&CP vol. 48.
Yaroslav Ganin et al., Domain-Adversarial Training of Neural Networks, Journal of Machine Learning Research 17 (2016) 1-35, submitted May 2015; published Apr. 2016.
Yaroslav Ganin et al., Unsupervised Domain Adaptataion by Backpropagation, Skolkovo Institute of Science and Technology (Skoltech), Moscow Region, Russia, Proceedings of the 32nd International Conference on Machine Learning, Lille, France, 2015, JMLR: W&CP vol. 37, copyright 2015 by the author(s), 11 pages.
Office Action dated Dec. 11, 2019 for U.S. Appl. No. 15/959,266 (pp. 1-15).
Office Action dated Dec. 7, 2020 for U.S. Appl. No. 16/563,608 (pp. 1-8).
Office Action dated Feb. 20, 2019 for U.S. Appl. No. 15/623,516 (pp. 1-8).
Office Action dated Feb. 25, 2020 for U.S. Appl. No. 15/960,113 (pp. 1-7).
Office Action dated Feb. 7, 2020 for U.S. Appl. No. 16/159,695 (pp. 1-8).
Office Action dated Jan. 10, 2020 for U.S. Appl. No. 16/228,767 (pp. 1-6).
Office Action dated Jan. 29, 2020 for U.S. Appl. No. 16/198,959 (p. 1-6).
Office Action dated Jul. 10, 2019 for U.S. Appl. No. 15/210,661 (pp. 1-12).
Office Action dated Jul. 26, 2019 for U.S. Appl. No. 16/159,695 (pp. 1-8).
Office Action dated Jul. 9, 2020 for U.S. Appl. No. 16/228,760 (pp. 1-17).
Office Action dated Jun. 19, 2020 for U.S. Appl. No. 16/699,629 (pp. 1-12).
Office Action dated Jun. 25, 2020 for U.S. Appl. No. 16/228,767 (pp. 1-27).
Office Action dated Jun. 25, 2021 for U.S. Appl. No. 16/899,720 (pp. 1-5).
Office Action dated Mar. 11, 2021 for U.S. Appl. No. 16/228,767 (pp. 1-23).
Office Action dated Mar. 20, 2020 for U.S. Appl. No. 15/210,661 (pp. 1-10).
Office Action dated Mar. 31, 2021 for U.S. Appl. No. 16/228,760 (pp. 1-21).
Office Action dated May 13, 2021 for U.S. Appl. No. 16/600,500 (pp. 1-9).
Office Action dated May 14, 2021 for U.S. Appl. No. 16/198,959 (pp. 1-6).
Office Action dated May 16, 2019 for U.S. Appl. No. 15/396,851 (pp. 1-7).
Office Action dated May 18, 2020 for U.S. Appl. No. 15/960,113 (pp. 1-21).
Office Action dated Oct. 17, 2019 for U.S. Appl. No. 15/897,804 (pp. 1-10).

(56) References Cited

OTHER PUBLICATIONS

Office Action dated Oct. 29, 2021 for U.S. Appl. No. 16/198,959 (pp. 1-7).
Office Action dated Oct. 31, 2019 for U.S. Appl. No. 15/671,107 (pp. 1-6).
Office Action dated Oct. 7, 2019 for U.S. Appl. No. 15/396,851 (pp. 1-9).
Office Action dated Sep. 16, 2021 for U.S. Appl. No. 16/600,496 (pp. 1-8).
Office Action dated Sep. 18, 2020 for U.S. Appl. No. 15/396,851 (pp. 1-14).
Office Action dated Sep. 21, 2020 for U.S. Appl. No. 16/198,959 (pp. 1-17).
Office Action dated Sep. 24, 2021 for U.S. Appl. No. 17/080,840 (pp. 1-9).
OGRECave/ogre—GitHub: ogre/Samples/Media/materials at 7de80a7483f20b50f2b10d7ac6de9d9c6c87d364, Mar. 26, 2020, 1 page.
Oikonomidis et al., "Efficient model-based 3D tracking of hand articulations using Kinect." In BmVC, vol. 1, No. 2, p. 3. 2011. (Year: 2011).
Optimal regularisation for acoustic source reconstruction by inverse methods, Y. Kim, P.A. Nelson, Institute of Sound and Vibration Research, University of Southampton, Southampton, SO17 1BJ, UK; 25 pages.
Oscar Martínez-Graullera et al., "2D array design based on Fermat spiral for ultrasound imaging", Ultrasonics, (Feb. 1, 2010), vol. 50, No. 2, ISSN 0041-624X, pp. 280-289, XP055210119.
Oyama et al., "Inverse kinematics learning for robotic arms with fewer degrees of freedom by modular neural network systems," 2005 IEEE/RSJ International Conference on Intelligent Robots and Systems, Edmonton, Alta., 2005, pp. 1791-1798, doi: 10.1109/IROS.2005.1545084. (Year: 2005).
Papoulis, A. (1977). Signal Analysis. The University of Michigan: McGraw-Hill, pp. 92-93.
Partial International Search Report for Application No. PCT/GB2018/053735, date of mailing Apr. 12, 2019, 14 pages.
Partial ISR for Application No. PCT/GB2020/050013 dated May 19, 2020 (16 pages).
Partial ISR for PCT/GB2023/050001 (Mar. 31, 2023) 13 pages.
Patricio Rodrigues, E., Francisco de Oliveira, T., Yassunori Matuda, M., & Buiochi, F. (Sep. 2019). Design and Construction of a 2-D Phased Array Ultrasonic Transducer for Coupling in Water. In INTER-NOISE and NOISE-CON Congress and Conference Proceedings (vol. 259, No. 4, pp. 5720-5731). Institute of Noise Control Engineering.
PCT Partial International Search Report for Application No. PCT/GB2018/053404 date of mailing Feb. 25, 2019, 13 pages.
Péter Tamás Kovács et al., "Tangible Holographic 3D Objects with Virtual Touch", Interactive Tabletops & Surfaces, ACM, 2 Penn Plaza, Suite 701 New York NY 10121-0701 USA, (Nov. 15, 2015), ISBN 978-1-4503-3899-8, pp. 319-324.
Phys.org, Touchable Hologram Becomes Reality, Aug. 6, 2009, by Lisa Zyga (2 pages).
Pompei, F.J. (2002), "Sound from Ultrasound: The Parametric Array as an Audible Sound Source", Massachusetts Institute of Technology (132 pages).
Prabhu, K. M. (2013). Window Functions and Their Applications in Signal Processing . CRC Press., pp. 87-127.
Rakkolainen et al., A Survey of Mid-Air Ultrasound Haptics and Its Applications (IEEE Transactions on Haptics), vol. 14, No. 1, 2021, 18 pages.
Rocchesso et al., Accessing and Selecting Menu Items by In-Air Touch, ACM CHItaly'19, Sep. 23-25, 2019, Padova, Italy (9 pages).
Rochelle Ackerley, Human C-Tactile Afferents Are Tuned to the Temperature of a Skin-Stroking Caress, J. Neurosci., Feb. 19, 2014, 34(8):2879-2883.
Ryoko Takahashi, Tactile Stimulation by Repetitive Lateral Movement of Midair Ultrasound Focus, Journal of Latex Class Files, vol. 14, No. 8, Aug. 2015.
Schmidt, Ralph, "Multiple Emitter Location and Signal Parameter Estimation" IEEE Transactions of Antenna and Propagation, vol. AP-34, No. 3, Mar. 1986, pp. 276-280.
Sean Gustafson et al., "Imaginary Phone", Proceedings of the 24th Annual ACM Symposium on User Interface Software and Techology: Oct. 16-19, 2011, Santa Barbara, CA, USA, ACM, New York, NY, Oct. 16, 2011, pp. 283-292, XP058006125, DOI: 10.1145/2047196.2047233, ISBN: 978-1-4503-0716-1.
Search report and Written Opinion of ISA for PCT/GB2015/050417 dated Jul. 8, 2016 (20 pages).

\* cited by examiner

REDUCING HARMONIC DISTORTION BY DITHERING

PRIOR APPLICATIONS

This application claims the benefit of U.S. Provisional Patent Application No. 62/914,487 filed on Oct. 13, 2019, which is incorporated by reference in its entirety.

The prior application, U.S. application Ser. No. 16/600,496 filed on Oct. 12, 2019, is incorporated by reference in its entirety.

FIELD OF THE DISCLOSURE

The present disclosure relates generally to signal processing that produces a substantially error-free signal preserving the amplitude and phase relative to a constant base frequency while allowing the carrier frequency to vary.

BACKGROUND

Carrier frequency is defined herein as the consequential instantaneous frequency of the output digital signal pulses. Base frequency is defined herein as the center frequency that is described by an unmoving or constant phase signal. It is known that any phase change in the signal also constitutes a frequency shift. In this case that is realized by the carrier frequency shifting away from the base frequency. To preserve compatibility with the input intended for the elements of a phased array, the input data to the method is considered to be the phase and duty cycle of a pulse-width modulation. This is measured with respect to a steady reference signal that is a fixed source at the base frequency.

Phased array systems rely on the production of an exact carrier frequency to function. To simplify systems, it is often assumed that the carrier frequency is emitted during all relevant times so that the system can be treated as time invariant. This time invariance is necessary for the input signals to the array element transducers to be treated as complex values.

Generating a constant frequency pulse-width modulated (PWM) digital signal with a given phase offset for all relevant times is trivial. But changing the state of a phased array system often involves changing the phase angle of the elements, which violates the time-invariance requirement. This results in many side-effects, including a shift in frequency. Since the digital signal generation assumes that the base frequency (the frequency with which the primitive phase angles are specified relative to) is equal to the carrier frequency for all relevant times, this causes errors in the digital signals output to each array element transducer. Thus, it is necessary for the development of a signal generation system that is capable of producing a digital signal using the free selection of amplitude and phase. This is used to produce a substantially error-free signal that preserves the amplitude and phase relative to a constant base frequency while allowing the carrier frequency to vary.

SUMMARY

The hardware-efficient method of generating the up-sampling of the phase represented as the evaluation of high-order polynomial interpolant is novel. The aim is to produce a PWM output that respects and correctly interprets changes in frequency while also preserving absolute phase and phase changes. Without loss of generality, this technique may be also restated with phase delays that produces a "sign flip" in angle from the technique described.

BRIEF DESCRIPTION OF THE DRAWINGS

The accompanying figures, where like reference numerals refer to identical or functionally similar elements throughout the separate views, together with the detailed description below, are incorporated in and form part of the specification, serve to further illustrate embodiments of concepts that include the claimed invention and explain various principles and advantages of those embodiments.

Figure 1:
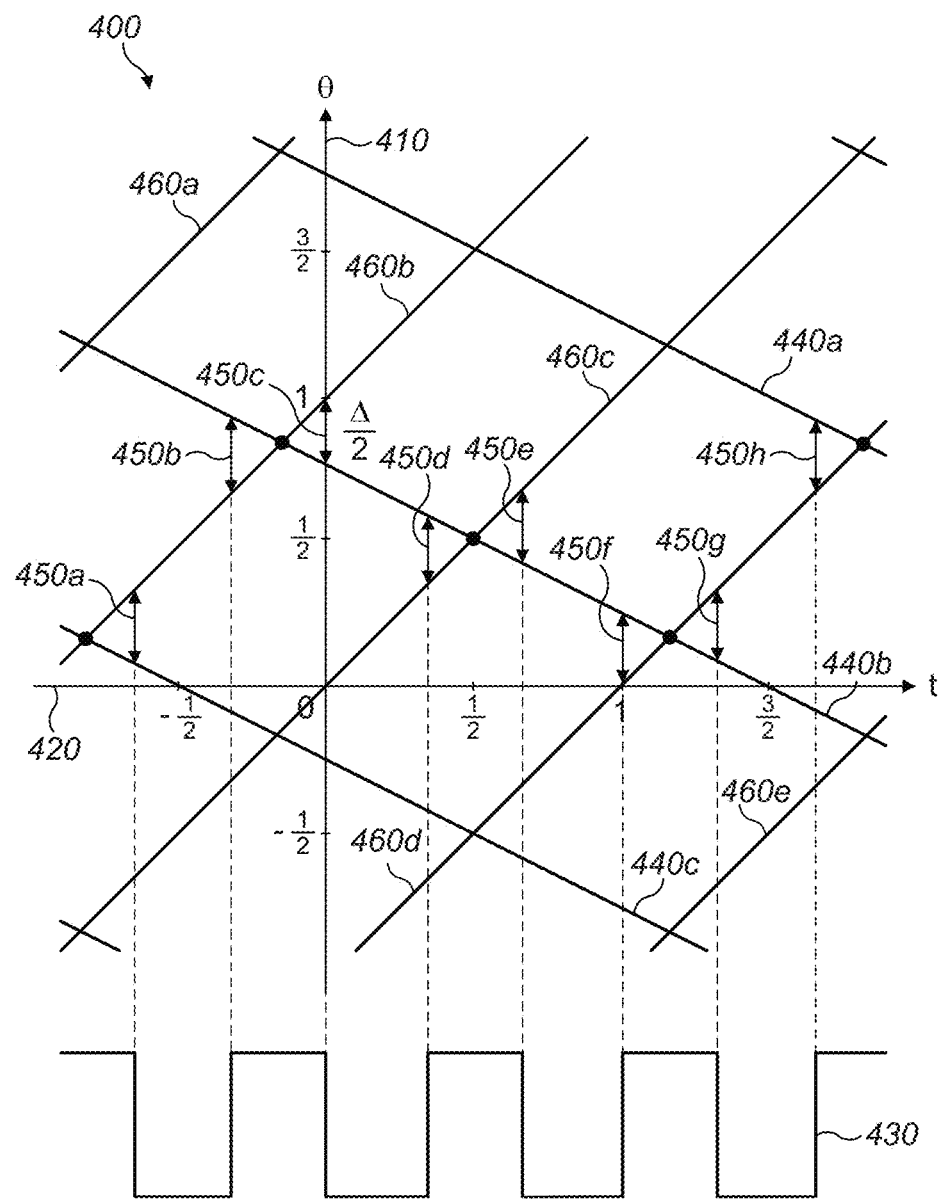
FIG. 1 shows geometric behavior of a system having 3/2 of a base frequency.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

I. Introduction

The moving phase angle may be considered as an equivalent formulations for a phase-frequency modulated wave:

$$\cos\left(\omega t + \int \frac{d\theta'(t)}{dt} dt + \theta\right) = \cos(\theta'(t) + \omega t) = \cos\left(\theta + \int \omega'(t) dt\right),$$

where $\theta'(t)$ is a time-dependent function of phase and $\omega'(t)$ is a time-dependent function of frequency. It can be seen that $d\theta'(t)/dt$ is a measure of deviation of the carrier frequency from the base frequency. This can be simplified by normalizing both angle and $\omega$ (divide through by the base frequency and $2\pi$ radians, $\theta$ now being measured in revolutions), yielding $\omega=1$.

Describing the phase delay $\theta'(t)$ may be achieved by interpolating phase offsets generated in subsequent base frequency steps by a polynomial, since it is beneficial for the frequency to be defined and continuous on the endpoints. The frequency is defined as:

$$\frac{d\theta'(t)}{dt} + \omega = \omega'(t),$$

where the first-time derivatives of phase angle also contribute to the instantaneous carrier frequency and thus form two derivative constraints:

$$\frac{d\theta'(t)}{dt} + \omega = \omega'(0) = \omega + \theta_0 - \theta_{-1},$$

$$\frac{d\theta'(t)}{dt} + \omega = \omega'(1) = \omega + \theta_1 - \theta_0.$$

The two endpoints of the interval in angle also have further constraints:

$\theta'(0)=\theta_0$.

$\theta'(1)=\theta_1$, which together with the constraints on carrier frequency make four in total. This necessitates a cubic polynomial interpolation for this level of continuity. As shown, defining $\omega'(0)$ and $\omega'(1)$ can be achieved using backwards differences, thus limiting the number of samples required in the future direction and reducing latency. This also reduces the total number of immediately available samples required from four to three precomputed samples of the phase angle and duty cycle of the intended signal.

The cubic form of the interpolating spline polynomial formed from backwards differences is:

$\theta'(t)=(-\theta_{-1}+2\theta_0-\theta_1)t^3+(2\theta_{-1}-4\theta_0+2\theta_1)t^2+(\theta_0-\theta_{-1})t+\theta_0$, which is repeated for every interval.

Further, the phase may be also represented by a lower degree polynomial.

Although this would imply sacrificing some of the continuity conditions, the reasonable approach is to produce discontinuities in frequency anyway (but importantly, phase continuity is preserved as only the time derivatives of the phase are discontinuous). Even with frequency discontinuities, the technique using this interpolant enjoys a significant accuracy improvement over the standard technique. The linear interpolant for such a method may be stated as:

$\theta'(t)=(\theta_1-\theta_0)t+\theta_0$.

Although the complexity of the implementation increases, higher order interpolation polynomials may equally be used without loss of generality. The on time of a digital signal is described by the duty cycle, which is assumed proportional to the amplitude of the signal. This motivates the name "pulse-width modulation." This can be realized here by adding an interpolation on the duty cycle value $\Delta$ of the signal encoded as a pulse-width percentage at the base frequency:

$\Delta'(t)=(\Delta_1-\Delta_0)t+\Delta_0$.

Defining the output signal going into the element as a digital approximation to:

$$\cos\left(\omega t + \int \frac{d\theta'(t)}{dt}dt + \theta\right) = \cos(\theta'(t) + \omega t),$$

so a time-varying $\theta$ phase offset with respect to the base frequency may also be viewed as a deviation from the base signal frequency $\theta$, effectively $d\theta'(t)/dt$. To search for the locations of the pulses, zeroes (also multiples of $2\pi$) of the angle input to the cosine function must be found. These correspond to peaks in the wave and high points in the digital signal. To achieve this, both angle and w are normalized (divide through by the frequency and $2\pi$ radians, all $\theta$ now being measured in revolutions), yielding $\omega=1$. Therefore, the condition being searched for is:

$\omega t-\theta'(t)=t-\theta'(t)=0$.

This describes the center of the pulse at each step.

To find the extent of the pulse around the center point, the value $|t-\theta'(t)|$ is computed. If it is smaller than a given value representing an amplitude, then the point in time is within the pulse, in the high region of the digital signal. Otherwise, the point in time is outside the pulse and in the low region of the digital signal.

II. Hardware Techniques to Create Suitable PWM Output

The hardware-efficient method of generating the up-sampling of the phase represented as the evaluation of high-order polynomial interpolant is also novel.

The aim is to produce a PWM output that respects and correctly interprets changes in frequency while also preserving absolute phase and phase changes. Without loss of generality, this technique may be also restated with phase delays that produces a "sign flip" in angle from the technique described.

The moving phase angle may be considered as an equivalent formulations for a phase-frequency modulated wave:

$$\cos\left(\omega t + \int \frac{d\theta'(t)}{dt}dt + \theta\right) = \cos(\theta'(t) + \omega t) = \cos\left(\theta + \int \omega'(t)dt\right),$$

where $\theta'(t)$ is a time-dependent function of phase and $\omega'(t)$ is a time-dependent function of frequency. It can be seen that $d\theta'(t)/dt$ is a measure of deviation of the carrier frequency from the base frequency. This can be simplified by normalizing both angle and $\omega$ (divide through by the base frequency and $2\pi$ radians, $\theta$ now being measured in revolutions), yielding $\omega=1$.

Describing the phase delay $\theta'(t)$ may be achieved by interpolating phase offsets generated in subsequent base frequency steps by a polynomial, since it is beneficial for the frequency to be defined and continuous on the endpoints. The frequency is defined as:

$$\frac{d\theta'(t)}{dt} + \omega = \omega'(t),$$

where the first-time derivatives of phase angle also contribute to the instantaneous carrier frequency and thus form two derivative constraints:

$$\frac{d\theta'(t)}{dt} + \omega = \omega'(0) = \omega + \theta_0 - \theta_{-1},$$

$$\frac{d\theta'(t)}{dt} + \omega = \omega'(1) = \omega + \theta_1 - \theta_0.$$

The two endpoints of the interval in angle also have further constraints:

$\theta'(0)=\theta_0$, $\theta'(1)=\theta_1$, which together with the constraints on carrier frequency make four in total. This necessitates a cubic polynomial interpolation for this level of continuity. As shown, defining ω'(0) and ω'(1) can be achieved using backwards differences, thus limiting the number of samples required in the future direction and reducing latency. This also reduces the total number of immediately available samples required from four to three precomputed samples of the phase angle and duty cycle of the intended signal.

The cubic form of the interpolating spline polynomial formed from backwards differences is:

$$\theta'(t)=(-\theta_{-1}+2\theta_0-\theta_1)t^3+(2\theta_{-1}-4\theta_0+2\theta_1)t^2+(\theta_0-\theta_{-1})t+\theta_0,$$

which is repeated for every interval.

Further, the phase may be also represented by a lower degree polynomial. Although this would imply sacrificing some of the continuity conditions, the reasonable approach is to produce discontinuities in frequency anyway (but importantly, phase continuity is preserved as only the time derivatives of the phase are discontinuous). Even with frequency discontinuities, the technique using this interpolant enjoys a significant accuracy improvement over the standard technique. The linear interpolant for such a method may be stated as:

$$\theta'(t)=(\theta_1-\theta_0)t+\theta_0.$$

Although the complexity of the implementation increases, higher order interpolation polynomials may equally be used without loss of generality. The on time of a digital signal is described by the duty cycle, which is assumed proportional to the amplitude of the signal. This motivates the name "pulse-width modulation." This can be realized here by adding an interpolation on the duty cycle value Δ of the signal encoded as a pulse-width percentage at the base frequency:

$$\Delta'(t)=(\Delta_1-\Delta_0)t+\Delta_0.$$

Defining the output signal going into the element as a digital approximation to:

$$\cos\left(\omega t + \int \frac{d\theta'(t)}{dt}dt + \theta\right) = \cos(\theta'(t) + \omega t),$$

so a time-varying θ phase offset with respect to the base frequency may also be viewed as a deviation from the base signal frequency ω, effectively dθ'(t)/dt. To search for the locations of the pulses, zeroes (also multiples of 2π) of the angle input to the cosine function must be found. These correspond to peaks in the wave and high points in the digital signal. To achieve this, both angle and w are normalized (divide through by the frequency and 2π radians, all θ now being measured in revolutions), yielding ω=1. Therefore, the condition being searched for is:

$$\omega t-\theta'(t)=t-\theta'(t)=0.$$

This describes the center of the pulse at each step.

To find the extent of the pulse around the center point, the value |t−θ'(t)| is computed. If it is smaller than a given value representing an amplitude, then the point in time is within the pulse, in the high region of the digital signal. Otherwise, the point in time is outside the pulse and in the low region of the digital signal.

FIGS. 1 through 4 geometrically demonstrate how testing that this value is less than Δ'(t)/2 generates the appropriate pulse.

FIG. 1 shows the geometrical behavior 400 for the edge case of 3/2 of the base frequency. In this graph, Δ is Δ(t), the y-axis 410 represents normalized angle (in revolutions) θ, and the x-axis 420 represents normalized time (in base frequency periods) t. This FIG. 1 is a geometric interpretation of the PWM generation when applied to a slowly decreasing phase (with derivative −½, negative slope down and to the right), relative to the base frequency represented by the diagonal phase lines 440a, 440b, 440c. The diagonal phase lines in this and in all other figures herein are graphed on a periodic domain and therefore "wrap around" the plots as shown. Thus, many of the apparent discontinuities represent the same curve.

The distance between the two sets of repeating curves crosses the threshold where it is less than Δ/2 (defined as half the duty cycle quantity) distance in a number of places 450a, 450b, 450c, 450d, 450e, 450f, 450g, 450h that repeat in time. These two sets of curves are the constant phase versus timelines 460a, 460b, 460c, 460d, 460e (θ=t or θ=ωt, but wrapped around in rotations and base frequency periods since w is normalized to one). This travels up and to the right of the diagram that represent the base frequency with zero phase offset behavior. The interpolated phase curves (ω'(t)) that represent the desired behavior that are an addition to this signal in phase 440a, 440b, 440c. Where the two curves "match" in phase closely enough (less than Δ/2), these regions represent the pulse parts of the pulse signals 430. The dashed vertical lines projected from the Δ/2 distance factors 450a, 450b, 450c, 450d, 450e, 450f, 450g, 450h show the places on the PWM signal 430 where the binary state is changed inducing pulse edges due to the Δ/2 distance factor being reached.

The constant phase versus timelines (θ=t or θ=ωt) travelling up and to the right of the diagram that represent the base frequency with zero phase offset behavior are repeated for every period of the base frequency. The repetition in the vertical direction shows that it is true for all integer numbers of rotations in angle. Thus, it is true even considering numerical wrap-around of the counters used to implement the method. This generates a PWM signal with a carrier frequency that is three-halves the base frequency (where the frequency multiplier is obtained by subtracting the instantaneous derivative of the interpolated phase lines θ'(t) (−½) from the derivative of the constant phase versus timelines θ=ωt (1), so 1−(−½)=3/2). At the bottom is the final digital signal 430 that is to drive the element made up of all of the points where the two sets of curves are less than Δ/2 distance apart.

Figure 2:
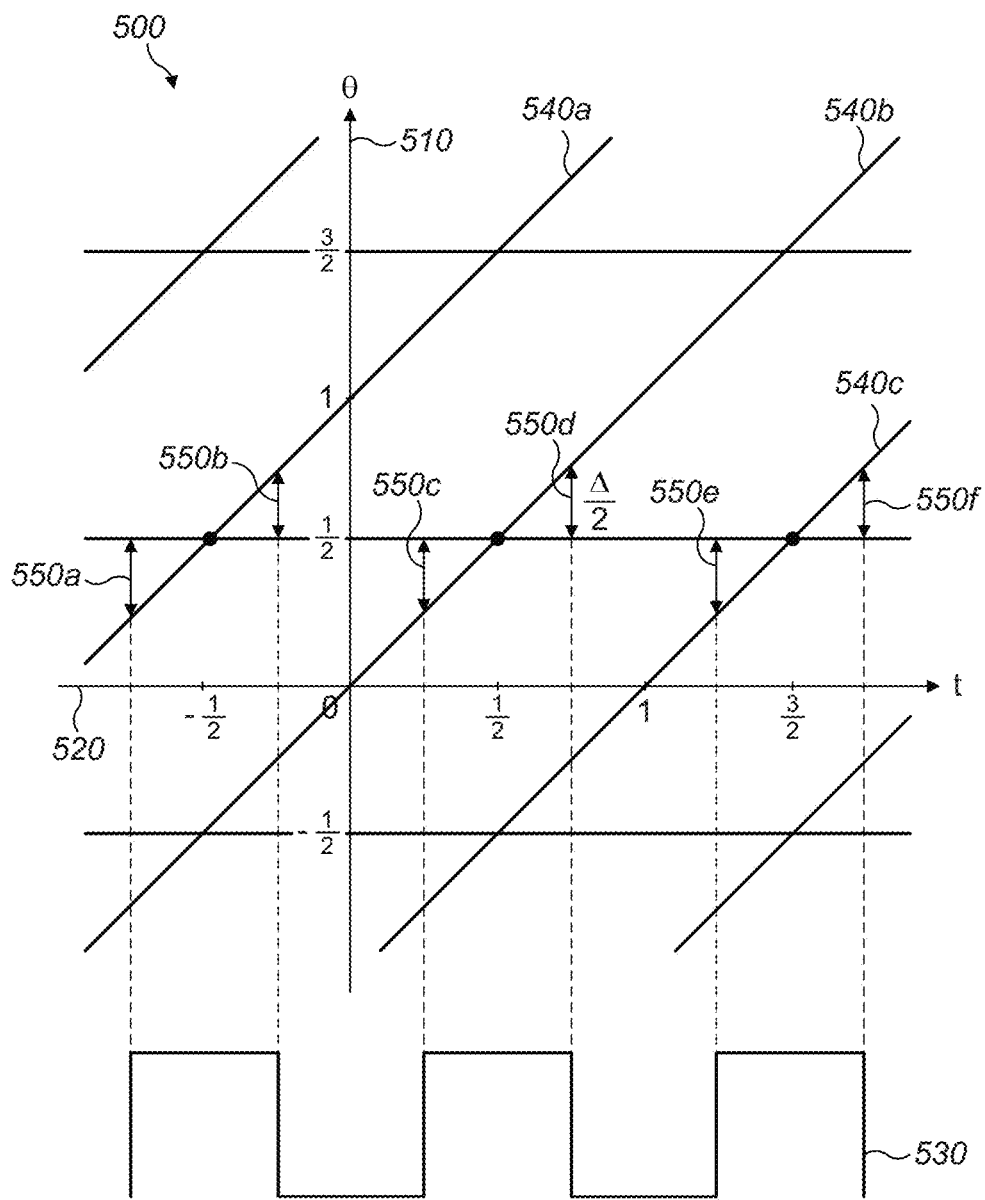
FIG. 2 shows geometric behavior of a system having exactly the base frequency.

FIG. 2 shows the geometrical behavior 500 for exactly the base frequency. In this graph, Δ is Δ(t), the y-axis 510 represents normalized angle (in revolutions) θ, and the x-axis 520 represents normalized time (in base frequency periods) t. Shown is a geometric interpretation of the PWM generation when applied to a flat constant phase angle θ'(t) (horizontal lines with derivative zero in time) that does not change relative to the base frequency represented by the diagonal phase lines 540a, 540b, 540c.

The distance Δ/2 550a, 550b, 550c, 550d, 550e, 550f again represents the transition points between the two states in the pulse signal. Thus, the two curves cross over exactly once per base frequency period because the interpolated phase curve is horizontal and represents a constant phase angle. This generates a PWM signal with a carrier frequency that is exactly equal to the base frequency (where the frequency multiplier is again obtained by subtracting the instantaneous derivative of the interpolated phase lines θ'(t)(0) from the derivative of the constant phase versus timelines θ=ωt (1), so 1−0=1). The dashed lines show the pulse edges in the pulsed signal. At the bottom is the final digital signal 530 that is to drive the element made up of all of the points where the two sets of curves are again less than Δ/2 distance apart.

Figure 3:
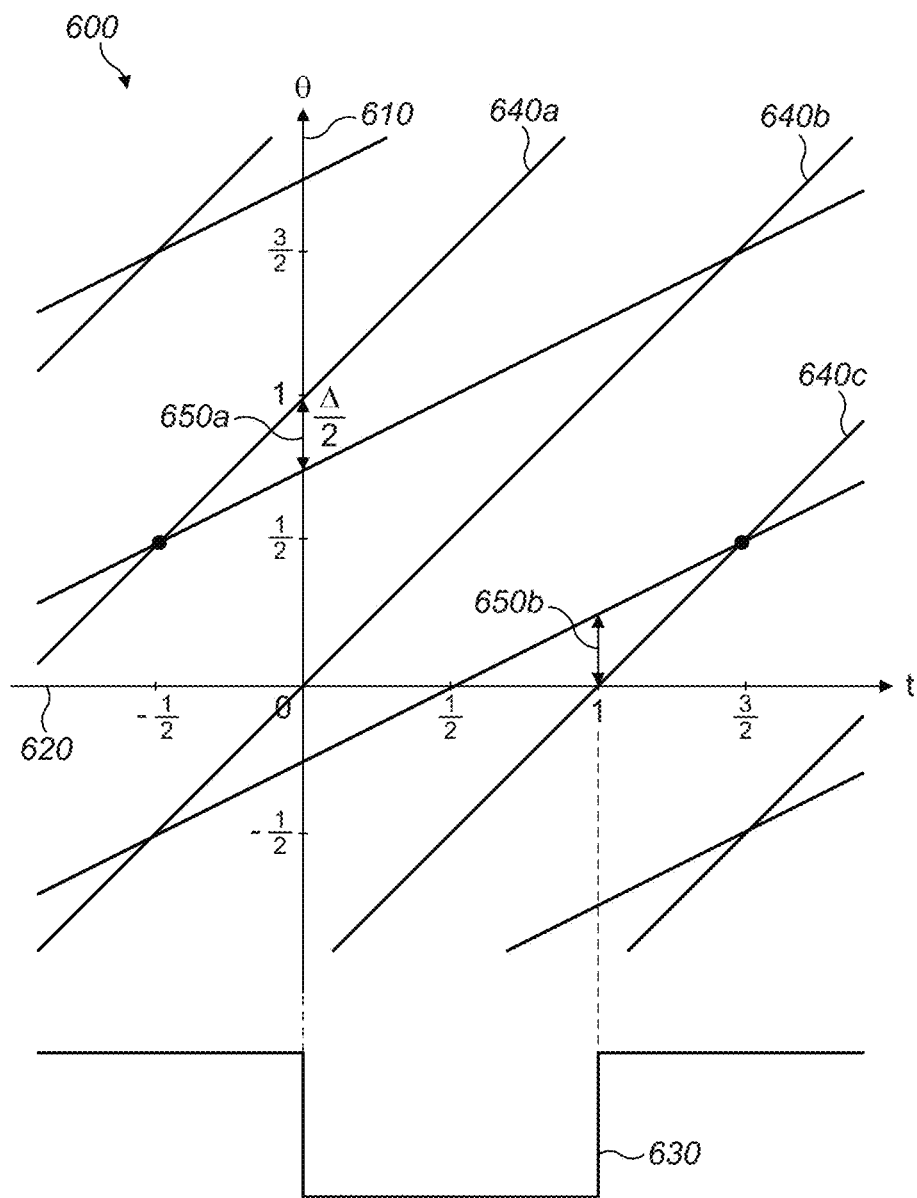
FIG. 3 shows geometric behavior of a system having a slowly increasing phase relative to the base frequency.

FIG. 3 shows the geometrical behavior 600 for the edge case of ½ the base frequency. In this graph, Δ is Δ(t), the y-axis 610 represents normalized angle (in revolutions) θ, and the x-axis 620 represents normalized time (in base frequency periods) t. The distance Δ/2 650a. 650b again represents the transition points between the two states in the pulse signal.

Shown is a geometric interpretation of the PWM generation when applied to an increasing phase θ'(t) (with derivative ½), relative to the base frequency represented by the diagonal phase lines 640a, 640b, 640c. This generates a PWM signal with a carrier frequency that is half the base frequency (w % here the frequency multiplier is obtained by subtracting the instantaneous derivative of the interpolated phase lines θ'(t) (+%$_2$) from the derivative of the constant phase versus time lines θ=ωt (1), so 1−(+½)=½). At the bottom is the final digital signal 630 that is to drive the element made up of all of the points where the two sets of curves are again less than Δ/2 distance apart.

Figure 4:
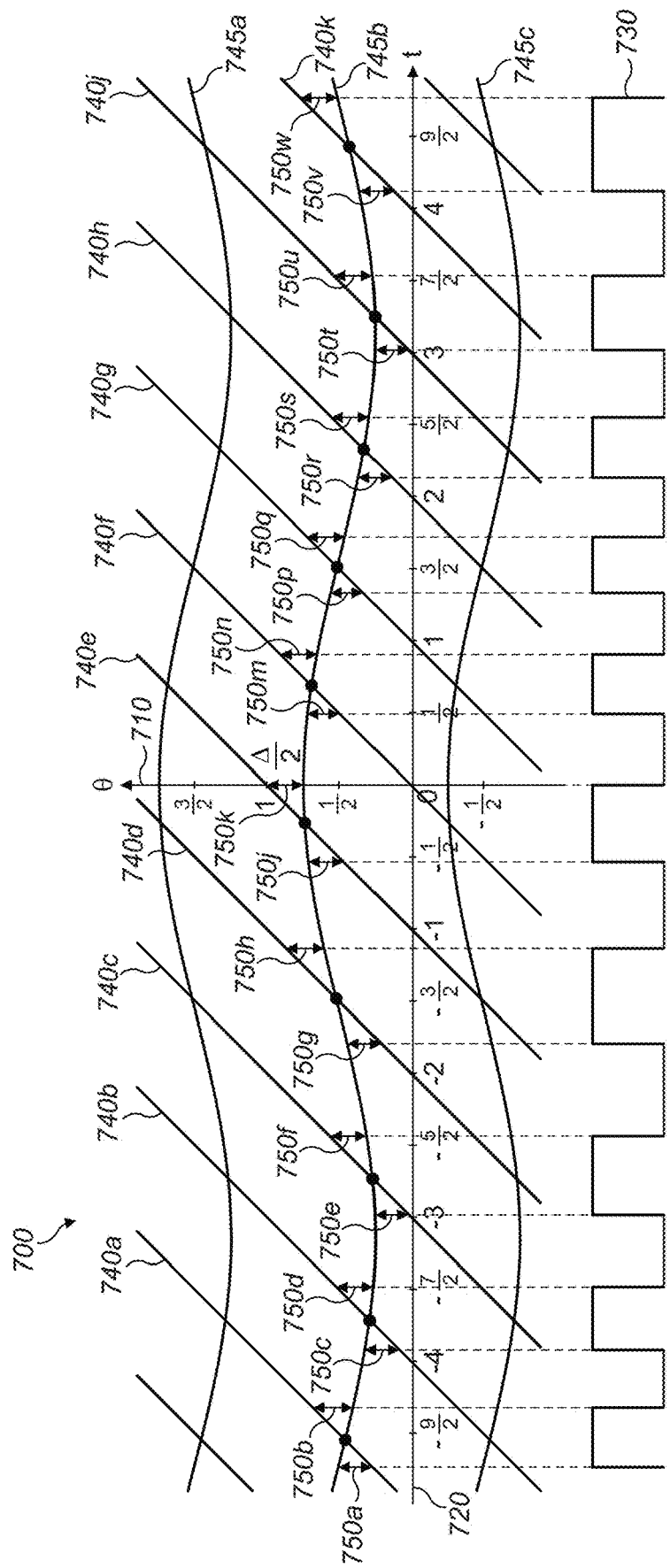
FIG. 4 shows geometric behavior of a system having an arbitrary function of phase angle relative to the base frequency.

FIG. 4 shows the geometrical behavior 700 as to how an example interpolated function where the gradient and thus frequency changes significantly over time fits into this geometric description. In this graph, Δ is Δ(t), the y-axis 710 represents normalized angle (in revolutions) θ, and the x-axis 720 represents normalized time (in base frequency periods) t. Shown is a geometric interpretation of the PWM generation when applied to a more arbitrarily defined function of phase angle, relative to the base frequency represented by the diagonal phase lines θ'(t) or θ=ωt 740a, 740b, 740c, 740d, 740e, 740f, 740g, 740h, 740j, 740k. The distance Δ/2 750a, 750b, 750c, 750d, 750e. 750f. 750g, 750h, 750j, 750k, 750m, 750n, 750p, 750q, 750r, 750s, 750t, 750u, 750v, 750w again represents the edges in the pulse signal. But here while they represent the same Δ/2 distance on the y-axis, they correspond to varying pulse length on the x-axis. The wavy horizontal lines 745a, 745b. 745c are the interpolated phase lines θ'(t) in this example.

The variation in the derivative of θ'(t) moves between positive derivative that generates longer pulses at a lower frequency and negative derivative that generates shorter pulses at a higher frequency. This is due to the crossings between y-axis distances smaller than Δ/2 and larger than Δ/2 changing their relative distance apart. At the bottom is the final digital signal 730 that is to drive the element, wherein pulse edges are induced when the signal y-axis distance crosses the Δ/2 threshold.

It can also be proven that the duty cycle value Δ'(t)/2 when used in this way scales appropriately with frequency for this scheme.

III. Conditional Test and Dithering

In order to obtain reduced harmonic distortion, it is beneficial to introduce dithering to alleviate artifacts generated by the discretization of the signal into precise digital sub-intervals (ticks). But in order to do so and not introduce further problems, it is necessary to ensure that each dithering operation on each rising and falling pulse edge on each element is uncorrelated. This is difficult to achieve in a hardware system, so some rearrangement of the scheme is required.

Having obtained θ'(t), Δ'(t) and t with counters, where θ'(t) and Δ'(t) can be arbitrary degree polynomials, these can now be used to evaluate:

$$|t-\theta'(t)| < +\Delta'(t)/2.$$

to test when this key condition that drives which Boolean state the pulse output is emitting is true when wrap-around is allowed in the function quantities, as described earlier. For efficiency in hardware systems and in order to control the beginning and end edge of each pulse individually, these are worked into two counters that have different tests applied to them as the negative and positive parts of the above test. This may be expressed as:

$$t - \theta'(t) \geq -\frac{\Delta'(t)}{2} \text{ and } t - \theta'(t) < \frac{\Delta'(t)}{2}.$$

As only the sign is important to conduct this test, an extra bit may be added to the counters to remove the divide by multiplying through by two:

$$2t-2\theta'(t) \geq -\Delta'(t) \text{ and } 2t-2\theta'(t) < +\Delta'(t).$$

Then the counters are rearranged to make this a sign test:

$$((2t-2\theta'(t))+\Delta'(t)) \leq 0 \text{ and } (2t-2\theta'(t))-\Delta'(t) < 0,$$

$$((2t-2\theta'(t))+\Delta(t))-\varepsilon \leq -\varepsilon \text{ and } (2t-2\theta'(t))-\Delta'(t) < 0,$$

$$((2t-2\theta'(t))+\Delta'(t))-\varepsilon < 0 \text{ and } (2t-2\theta'(t))-\Delta'(t) < 0,$$

where the physical manifestation of ε is generally just the least significant bit and the space of numbers in which the counter operates is reworked to be signed.

As a result, two final counters may be constructed for these quantities, wherein the sign bits of the counters denote whether or not the test succeeded as the result of the logical AND operator applied to both of their sign bits. An implementation may choose to use the AND operator for less than 50% duty cycle (Δ'(t)≤½) and the logical OR operator for greater than 50% duty cycle (Δ'(t)≥½), where at a 50% duty cycle both operators produce the same result. This is further complicated by the fact that the counters swap roles when the duty cycle crosses 50%, at over 50% duty cycle, the 'begin' counter controls the falling edge and the 'end' counter controls the rising edge.

For brevity, the following describes a degree one (linear) polynomial implementation of θ'(t) and Δ'(t). The required counters for the edges 'begin' and 'end' may be expanded into:

$$\text{begin}:=-(((\Delta_1'-\Delta_0')t+\Delta_0')+(2t-2((\theta_1-\theta_0')t+\theta_0'))+\varepsilon),$$

$$\text{end}:=-(((\Delta_1'-\Delta_0')t+\Delta')-(2t-2((\theta_1-\theta_0)t+\theta_0')))$$

Because this is a linear example, these may be broken down into sub-counters by evaluating and taking the derivative of each counter and evaluating at the start of the interval to determine the starting values and constants to be computed. For greater degree polynomials, the counters may be used as described in the previous section, but for this linear example, only two initializing constants and two derivatives are required:

$$\text{begin}_0 := -(\Delta_0' - \theta_0') - \varepsilon,$$

$$\frac{d\text{begin}}{dt} := -((\Delta_1' - \Delta_0') - 2(1 - (\theta_1' - \theta_0'))),$$

-continued $$end_0 := -(\Delta'_0 - \theta'_0),$$

$$\frac{dend}{dt} := -((\Delta'_1 - \Delta'_0) + 2(1 - (\theta'_1 - \theta'_0))).$$

As before, rewriting this to use real digital logic with counters and bit shifting means replacing t in the interval [0, 1) with k that represents the number of discrete ticks passed since the interval began. Defining the number of ticks per interval as $2^P$, this then makes the initial counter values (assuming the inputs are in the interval [0, 1) and not already in fractions of $2^P$, which would be in the interval $[0, 2^P-1]$):

$$begin_0 := -2^{2p}(\Delta'_0 - 2\Delta'_0) - 1,$$

$$\frac{dbegin}{dt} := -2^p((\Delta'_1 - \Delta'_0) - (2 - (2\theta'_1 - 2\theta'_0))),$$

$$end_0 := -2^{2p}(\Delta'_0 + 2\theta'_0),$$

$$\frac{dend}{dt} := -2^p((\Delta'_1 - \Delta'_0) + (2 - (2\theta'_1 - 2\theta'_0)))$$

where ε has been replaced with a digital 1, the smallest non-zero value in the representation.

These given assignments are then the initial value of the 'begin' and 'end' counters and their respective delta increments which are applied at the beginning of each digital tick, as the evaluations required are:

$$begin(t) := begin_0 + \frac{dbegin}{dt}k.$$

$$end(t) := end_0 + \frac{dend}{dt}k.$$

As described before, then applying logical bit operators to the sign bit of both 'begin' and 'end' is used to produce the final state for the pulse output.

IV. Unweighted Dither

As stated, due to artefacts introduced by the discretization into digital ticks it is necessary to add dither to the system to ameliorate the effects of the signal quantization.

To alleviate the quantization effects, reduce the sidebands and thus distortion in the output, each pulse edge has a probabilistic dither added to it. But because of the way the positions of the edges are determined parametrically, it is difficult to add dither that varies the edge position by a single tick when the frequency of each interval (or each tick for higher order polynomials) may be different over time.

Adding dither to each edge in t (whose crossing and thus edge position is determined parametrically) would require significant extra operations (at least a multiplication, which would be expensive). This would determine how to move the edge by a prescribed amount in t, likely by adding a weighted dither factor to the parametrically defined edge counter that can be viewed as moving primarily in θ.

An alternative approach, is to not weight the dither and apply it directly to the counter (that is use 'unweighted' dither), thereby dithering in the 'phase angle' space θ, rather than directly in time t. This can be viewed as dithering by moving or jittering one of the curves in FIGS. 1, 2, 3 and 4 in the 'phase angle' axis θ instead of moving or jittering the curve along the time axis t. This means that the dither is then projected through the parametric definition of the edge location. Effectively this just means that more dither is applied when the instantaneous carrier is at lower frequencies and less is applied when the instantaneous carrier is at higher frequencies, as a movement in θ generates a greater or lesser movement in t respectively in those situations.

To add this approach onto the two edges in the method, two dither values are produced: one for the 'begin' counter begin(t) and one for the 'end' counter end(t). These are defined as the integer values:

$$begin_\delta := 2(2^P \times uniformRandom([0,1))),$$

$$end_\delta := 2(2^P \times uniformRandom([0,1))),$$

where the result in each case is ideally a uniformly distributed random integer value in the interval $[0, 2^{P+1}-1]$ (but if implemented as a linear-feedback shift register (LFSR) can be reasonably $[1, 2^{P+1}-1]$).

The evaluations are now:

$$begin_d(t) := begin_0 + \frac{dbegin}{dt}k - begin_\delta,$$

$$end_d(t) := end_0 + \frac{dend}{dt}k + end_\delta,$$

where the dithers are applied with opposite sign to each so as not to bias the final output of the device.

Expanding these $begin_d(t)$ and $end_d(t)$ out we have:

$$begin_d(t) :=$$
$$-2^{2p}\left(\Delta'_0 - 2\left(\theta'_0 - \frac{begin_\delta}{2^{p+1}}\right)\right) - 2^p((\Delta'_1 - \Delta'_0) - (2 - (2\theta'_1 - 2\theta'_0)))k - 1,$$

$$end_d(t) := -2^{2p}\left(\Delta'_0 - 2\left(\theta'_0 - \frac{end_\delta}{2^{p+1}}\right)\right) - 2^p((\Delta'_1 - \Delta'_0) - (2 - (2\theta'_1 - 2\theta'_0)))k,$$

First, this effectively moves the phase by up to one tick on each edge. Second, as the expected value of a uniform distribution on the interval [0,1) is a half, it is expected that this causes bias on the phase of every pulse edge by half a sample but does not bias the duty cycle. Thus, the amplitude is not modified overall. Biasing every pulse by half a sample, as every element in the system is driven by the same electronics, does not have an effect and so can be neglected.

A final complication in implementing this approach is that since multiple rising or falling edges may occur in a single base frequency period and the edges may occur anywhere in the timeline. Thus, the time at which the random dither values $begin_\delta$ and $end_\delta$ are changed must be chosen carefully. It is necessary to find a way to reinitialize each of the random dither values $begin_\delta$ and $end_\delta$ at time where edges can be guaranteed not to fall. This ensures there are no race conditions which could cause spurious pulses if the dither amount is modified on the same clock cycle as it modifies where the edge falls. It would also be inadvisable to allow the same dither value to apply for more than one edge as it would correlate these edges.

A system that achieves this is one where it can be guaranteed that a jump in the dither values $begin_\delta$ and $end_\delta$ cannot affect the final pulse shape. This occurs during the parts of the counter cycle where the most significant bits for each counter place them outside of any region where their sign may affect the location of an edge. Assume that the values of the begin(t) and end(t) counters are interpreted as to be in the signed interval [−½,+½) or the upper bits may be neglected to place it in this range. To ensure that it is not near a sign change, the easiest method is to test and reinitialize the dither value if, and only if, the counter lies in the interval [+⅛,+⅜) or [−⅜,−⅛) to ensure sufficient time to reinitialize the random values. These intervals in particular can be determined by checking the sign bit and asserting that the next two most significant bits must XOR to a Boolean true.

A simple method for achieving this is to create a linear feedback shift register (LFSR) that embody the begin$_\delta$ and end$_\delta$ values. By only allowing the register to be clocked by one bit while the above conditions are true, which as long as the value is much shorter in bits than one quarter of the ticks in the interval, this effectively make the jitter randomly selected for each rising and falling edge.

Turning to FIGS. 5A, 5B, 5C and 5D, shown are visualizations of the key parameters for a 25% duty cycle linear phase and duty realization of the method used to produce the jitter or dither effect on the output signal.

Figure 5A:
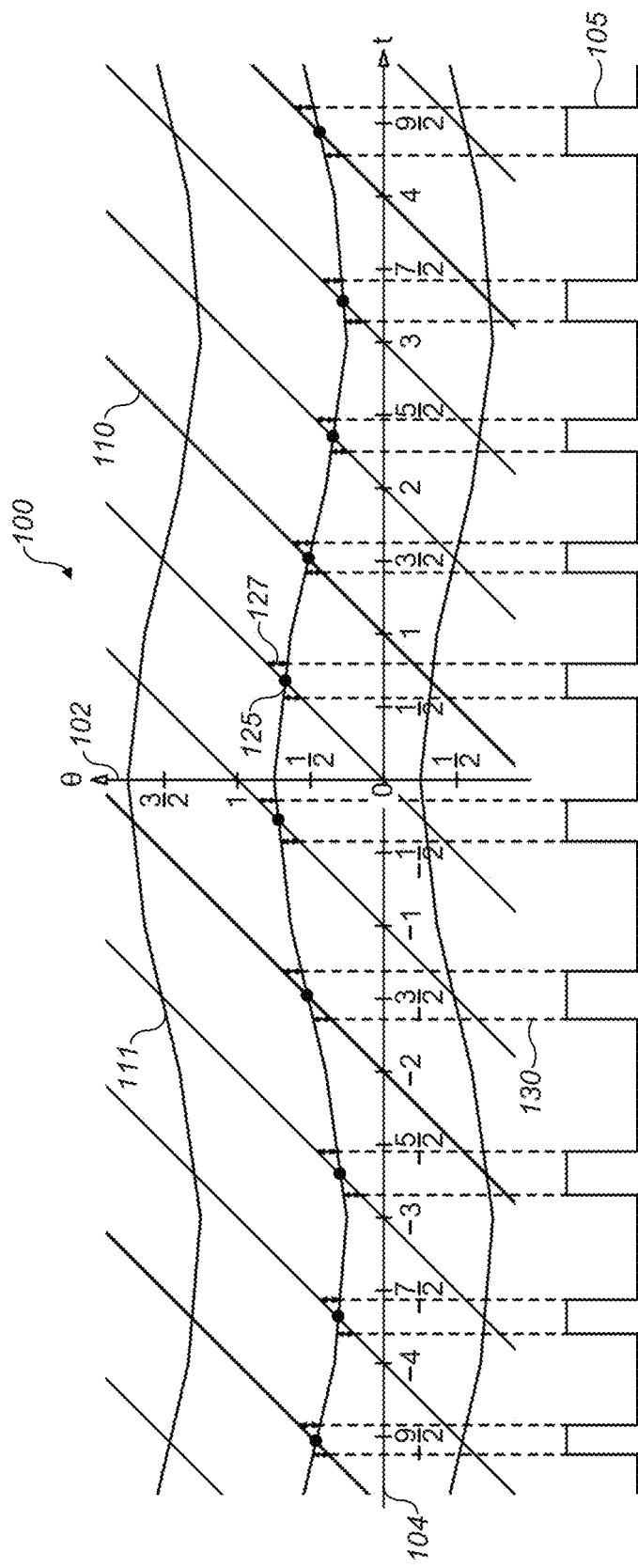
FIGS. 5A-5D show visualizations of the key parameters for a 25% duty cycle linear phase and duty realization of the disclosed method.

FIG. 5A shows a plot 100 of θ=θ'(t) and θ=t to show the key distance parameter (Δ'(t))/2 and how its projection produces the edges in the final pulse signal. The x-axis 104 shows the again normalized time (in base frequency periods) t, while the y-axis 102 shows normalized phase angle (in revolutions) θ. The signal 105 now shows a 25% duty cycle to illustrate how the counter mechanism preserves duty cycle percentage whilst the phase and frequency varies. The dashed vertical lines 130 show how the distance test of the difference between θ=θ'(t) and θ=t being less than (Δ'(t))/2 (which is ⅛ in the illustration) maps onto a signal with a duty cycle of 25%. The horizontal wavy lines 111 are the linearly interpolated θ values from (in this embodiment) each base frequency tick, θ=θ'(t), a function representing a sinusoidal variation in phase which gives rise to a sinusoidal variation in frequency of the final output pulse width (amplitude), phase and frequency modulated signal. The diagonal lines 110 as before show the lines θ=t. The vertices 125 show the locations where the difference between θ=θ'(t) and θ=t is zero, corresponding to the center point of the high region of the output signal. The vertical arrows 127 show the extent of the difference between the lines depicting θ=θ'(t) and θ=t where the magnitude of this difference is (Δ'(t))/2, denoting the edge of the output signal.

Figure 5B:
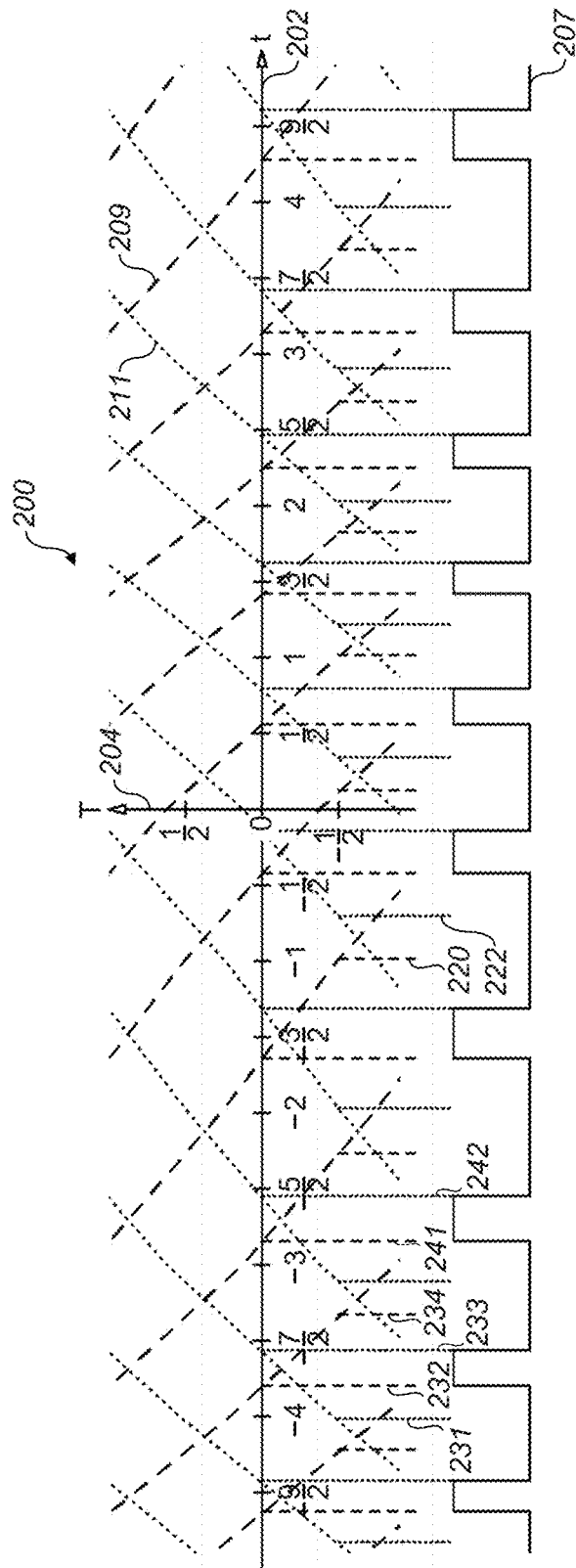

FIG. 5B shows a plot 200 of the counters "begin(t)" and "end(t)" to show how the sign bits of the counters with wrap-around, when a logical AND is applied (the region that is the intersection and is between both dashed lines 232 and 234 but also at the same time between dotted lines 231 and 233 is the region which describes the high part of the final signal) produce the same digital signal. The x-axis 202 shows the again normalized time (in base frequency periods) t, but in this figure the y-axis 204 shows now T which can be interpreted as the fractional number of periods of the output signal. The dashed diagonal lines 209 show the function "begin(t)" which is θ'(t)−t shifted by (Δ'(t))/2 to produce at zero (T=0) the rising edge of the output signal. The dotted diagonal lines 211 show the function "end(t)" which is θ'(t)−t shifted in the opposite direction by (Δ'(t))/2 to produce at zero (T=0) the other edge, correspondingly the falling edge of the output signal. The vertical dashed line 232 corresponds to the point where the dashed diagonal line 209 crosses T=0, the x-axis, which project down onto the rising edge of the output signal. The vertical dotted line 233 corresponds to the point where the dotted diagonal line 211 crosses T=0, the x-axis. The vertical dashed line 220 corresponds to the point where the dashed diagonal line crosses the T=(+/−)% which is the antipodean point to the rising edge and a location in time wherein applying a probabilistic jitter (a discontinuity) to the "begin(t)" counter cannot affect the output signal and so cannot generate runt pulses or other signal artifacts. (As used herein, "antipodean" means a point 180 degrees in phase away from a point of interest in a digital signal.) The vertical dotted line 222 corresponds to the point where the dotted diagonal line crosses the T=(+/−)½, which is the antipodean point to the falling edge and a location in time wherein applying a probabilistic jitter (a discontinuity) to the "end(t)" counter cannot affect the output signal and so cannot generate runt pulses or other signal artifacts. The signal 207 shows the output pulse width (amplitude), phase and frequency modulated signal.

Figure 5C:
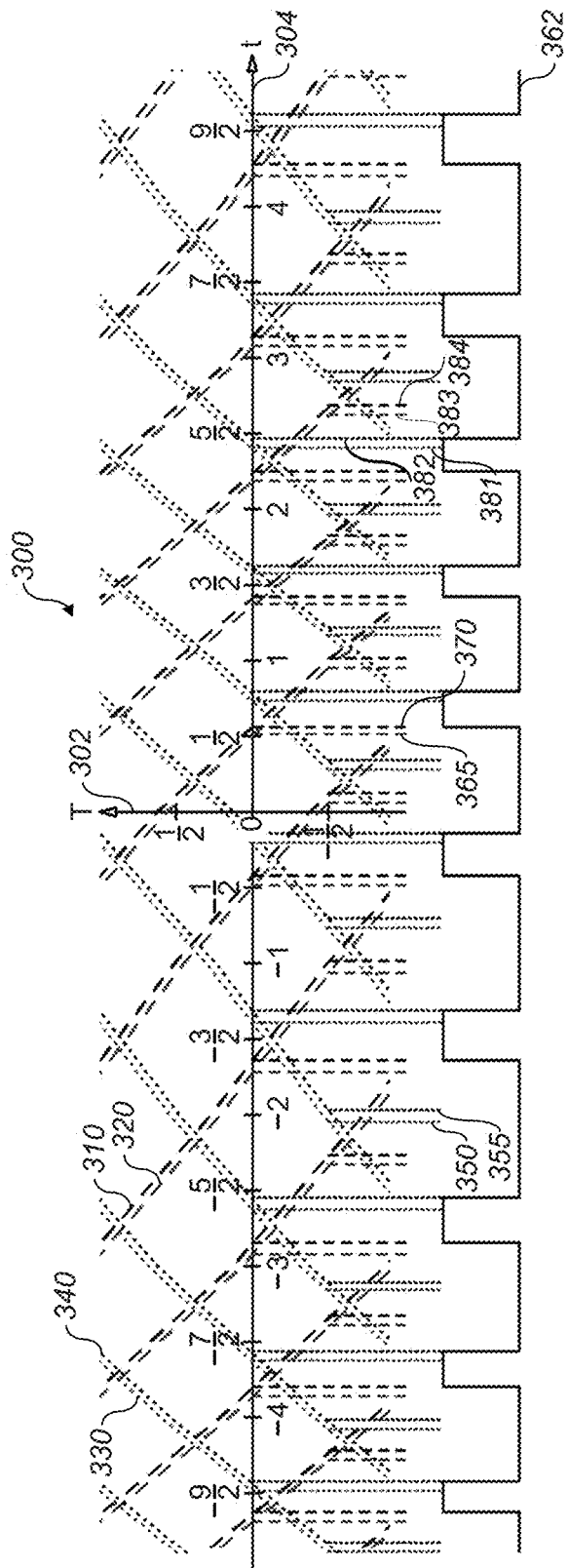
Figure 5D:
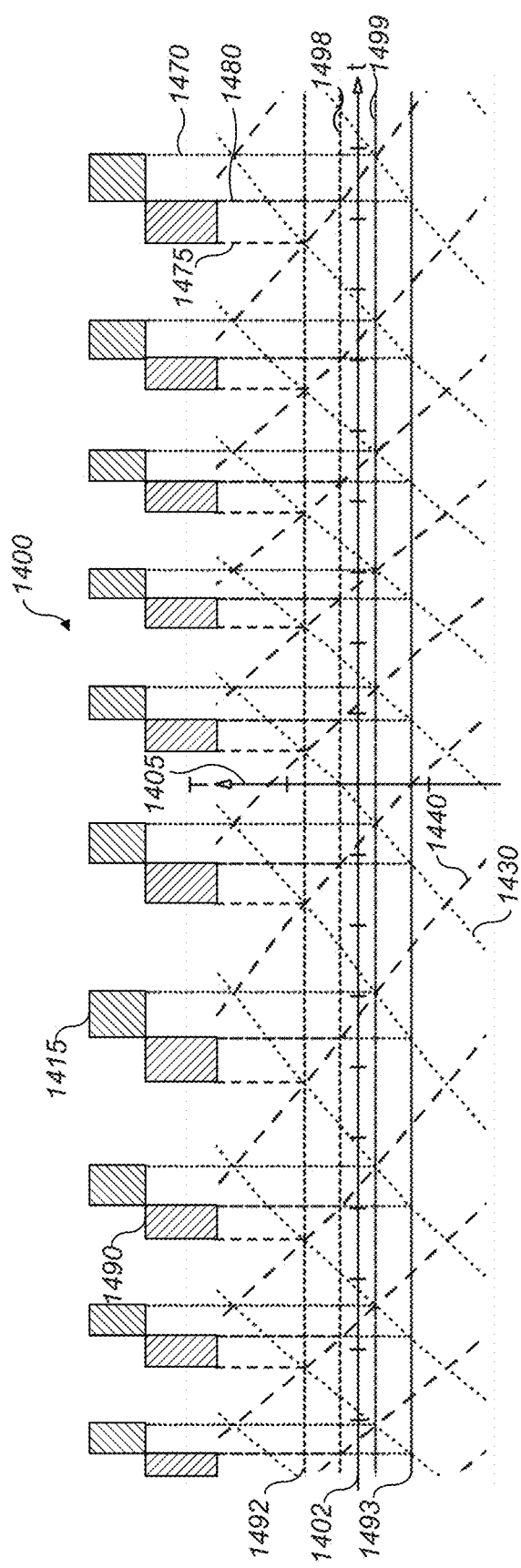

FIG. 5C shows a plot 300 of "begin(t)" (dashed) and "end(t)" (dotted) with an exaggerated extent of the unweighted dither shown as paler dashed ("begin(t)") and paler dotted ("end(t)") and how this might modify the output signal shown by introducing uncertainty in the edge locations. The x-axis 304 shows the again normalized time (in base frequency periods) t. The y-axis 302 shows T which can be interpreted as the fractional number of periods of the output signal. The darker dashed diagonal lines 310 show the function "begin(t)" which is θ'(t)−t shifted by (Δ'(t))/2 to produce at zero (T=0) the rising edge of the output signal. The paler dashed diagonal lines 320 show the function "begin(t)", but this time shifted by the maximum quantity of dither to define between the diagonal lines 310 and 320 the range of possible locations for a dithered diagonal line representing the function "begin(t)". The darker dotted diagonal lines 340 show the function "end(t)" which is θ'(t)−t shifted in the opposite direction by (Δ'(t))/2 to produce at zero (T=0) the other edge, correspondingly the falling edge of the output signal. The paler dotted diagonal lines 330 show the function "end(t)", but this time shifted by the maximum quantity of dither to define between the diagonal lines 340 and 330 the range of possible locations for a dithered diagonal line representing the function "end(t)". The darker vertical dashed line 370 corresponds to the point where the darker dashed diagonal line 310 crosses T=0, the x-axis, which projects down onto the latest possible rising edge of the output signal. The paler vertical dashed line 365 corresponds to the point where the paler dashed diagonal line 320 crosses T=0, the x-axis, which projects down onto the earliest possible rising edge of the output signal. The darker vertical dotted line 382 corresponds to the point where the darker dotted diagonal line 340 crosses T=0, the x-axis, which projects down onto the latest possible falling edge of the output signal. The paler vertical dotted line 381 corresponds to the point where the paler dotted diagonal line 330 crosses T=0, the x-axis, which projects down onto the earliest possible falling edge of the output signal. The darker vertical dashed line 384 corresponds to the latest point in time and the paler vertical dashed line 383 corresponds to the earliest point in time where the dashed diagonal line crosses the T=(+/−)½, which is the antipodean point to the rising edge and defines a location in time wherein applying a probabilistic jitter (a discontinuity) to the "begin(t)" counter cannot affect the output signal and so cannot generate runt pulses or other signal artifacts, even though this is dependent on the very counter to which dither is applied. The darker vertical dotted line 355 corresponds to the latest point in time and the paler vertical dotted line 350 corresponds to the earliest point in time where the dotted diagonal line crosses the T=(+/−)½, which is the antipodean point to the falling edge and defines a location in time wherein applying a probabilistic jitter (a discontinuity) to the "end(t)" counter cannot affect the output signal and so cannot generate runt pulses or other signal artifacts, even though this is dependent on the very counter to which dither is applied. The signal 362 is for reference an output signal created from the latest possible (un-dithered) counters, showing that there is a consistent systematic probabilistic bias of half of the dither width which may be neglected.

FIG. 5 shows a plot 1400 of the reinitialization times (hatched boxes) of the dither values ⟦"begin"⟧_δ and ⟦"end"⟧_δ, note that hatched boxes for the "begin(t)" cannot occur during an edge whose location may be changed by different value for ⟦"begin"⟧_δ and vice versa. The x-axis 1402 shows the again normalized time (in base frequency periods) t. The y-axis 1405 shows T which can be interpreted as the fractional number of periods of the output signal. The dashed diagonal lines 1440 show the function "begin(t)" which is $\theta'(t)-t$ shifted by $(\Delta'(t))/2$ to produce at zero (T=0) the rising edge of the output signal, but at other values of T (such as between the dashed horizontal lines T=+⅛ 1498 and T=+⅜ 1492) can be used to determine an appropriate window in which to apply a discontinuity in the form of probabilistic jitter to the counter "begin(t)" and thus the rising edge. The dotted diagonal lines 1430 show the function "end(t)" which is $\theta'(t)-t$ shifted by $(\Delta'(t))/2$ to produce at zero (T=0) the falling edge of the output signal, but at other values of T (such as between the dotted horizontal lines T=−⅜ 1493 and T=−⅛ 1499) can be used to determine an appropriate window in which to apply a discontinuity in the form of probabilistic jitter to the counter "end(t)" and thus the falling edge. The vertical dashed line 1475 and the co-located dotted and dashed line 1480 denote the beginning and end of the region of time generated by the projection of T, in which it is valid to discontinuously modify the jitter of the function "begin(t)" safely, illustrated as left-side lined boxes 1490. The co-located dotted and dashed line 1480 and vertical dotted line 1470 denote the beginning and end of the region of time generated by the projection of T, in which it is valid to discontinuously modify the jitter of the function "end(t)" safely, illustrated as right-side lined boxes 1415.

Turning to FIGS. 6A, 6B, 6C and 6D, shown are visualizations of the key parameters for a 75% duty cycle linear phase and duty realization of the method.

Figure 6A:
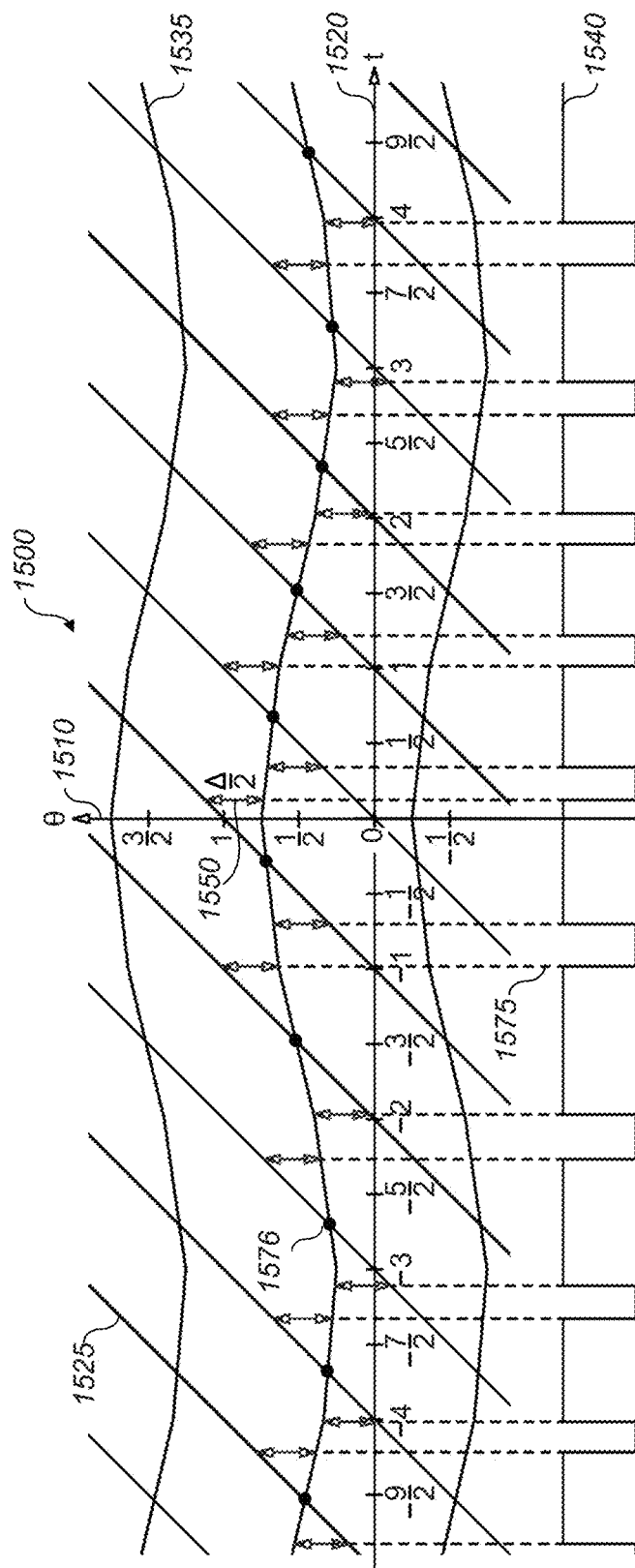
FIGS. 6A-6D show visualizations of the key parameters for a 75% duty cycle linear phase and duty realization of the disclosed method.

FIG. 6A shows a plot 1500 of $\theta=\theta'(t)$ and $\theta=t$ to show the key distance parameter $(\Delta'(t))/2$ and how its projection produces the edges in the final pulse signal. The x-axis 1520 shows the again normalized time (in base frequency periods) t, while the y-axis 1510 shows normalized phase angle (in revolutions) θ. The signal 1540 now shows a 75% duty cycle to illustrate how the counter mechanism preserves duty cycle percentage whilst the phase and frequency varies. The dashed vertical lines 1575 show how the distance test of the difference between $\theta=\theta'(t)$ and $\theta=t$ being less than $(\Delta'(t))/2$ (which is ⅜ in the illustration) maps onto a signal with a duty cycle of 75%. The horizontal wavy lines 1535 are the linearly interpolated θ values from (in this embodiment) each base frequency tick, $\theta=\theta'(t)$, a function representing a sinusoidal variation in phase which gives rise to a sinusoidal variation in frequency of the final output pulse width (amplitude), phase and frequency modulated. The diagonal lines 1525 as before show the lines θ=t. The vertices 1576 show the locations where the difference between $\theta=\theta'(t)$ and θ=t is zero, corresponding to the center point of the high region of the output signal. The vertical arrows 1550 show the extent of the difference between the lines depicting $\theta=\theta'(t)$ and θ=t where the magnitude of this difference is $(\Delta'(t))/2$, denoting the edge of the output signal.

Figure 6B:
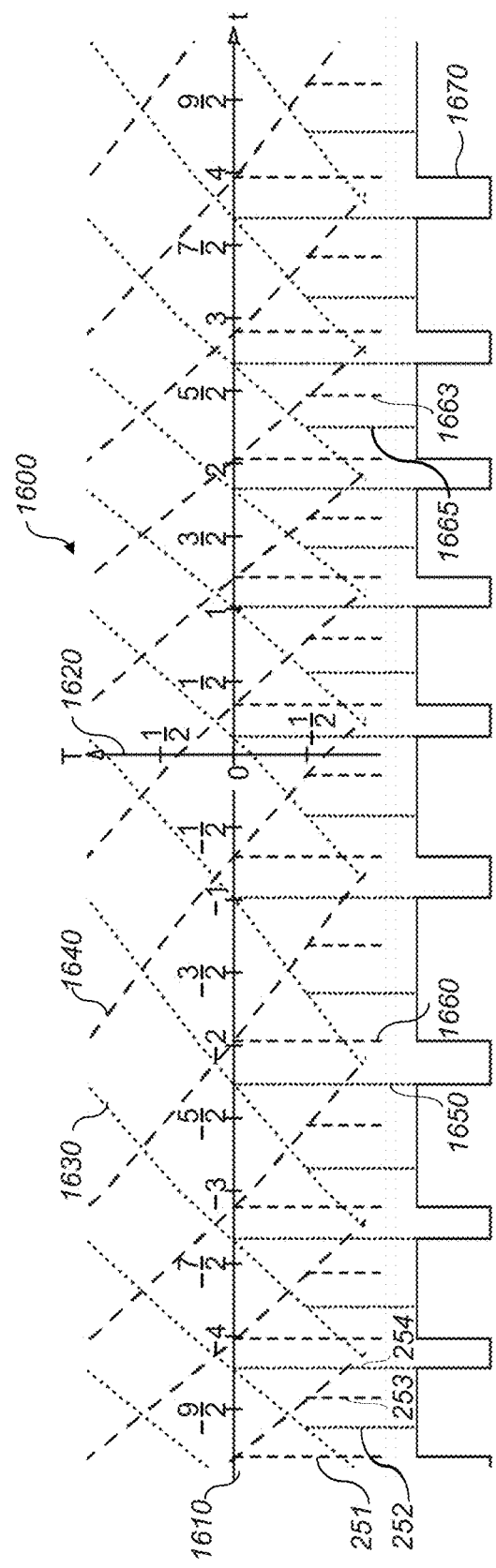

FIG. 6B shows a plot 1600 of the counters "begin(t)" and "end(t)" to show how the sign bits of the counters with wrap-around, when a logical OR is applied (the region that is the union and is formed jointly from the interval between both dashed lines 251 and 253 but also at the same time between dotted lines 252 and 254 is the region which describes the high part of the final signal) produce the same digital signal. The x-axis 1610 shows the again normalized time (in base frequency periods) t, but in this figure the y-axis 1620 shows now T which can be interpreted as the fractional number of periods of the output signal. The dashed diagonal lines 1640 show the function "begin(t)" which is $\theta'(t)-t$ shifted by $(\Delta'(t))/2$ to produce at zero (T=0) the rising edge of the output signal. The dotted diagonal lines 1630 show the function "end(t)" which is $\theta'(t)-t$ shifted in the opposite direction by $(\Delta'(t))/2$ to produce at zero (T=0) the other edge, correspondingly the falling edge of the output signal. The vertical dashed line 1660 corresponds to the point where the dashed diagonal line 1640 crosses T=0, the x-axis, which project down onto the rising edge of the output signal. The vertical dotted line 1650 corresponds to the point where the dotted diagonal line 1630 crosses T=0, the x-axis. The vertical dashed line 1663 corresponds to the point where the dashed diagonal line crosses the T=(+/−)½, which is the antipodean point to the rising edge and a location in time wherein applying a probabilistic jitter (a discontinuity) to the "begin(t)" counter cannot affect the output signal and so cannot generate runt pulses or other signal artifacts. The vertical dotted line 1665 corresponds to the point where the dotted diagonal line crosses the T=(+/−)½, which is the antipodean point to the falling edge and a location in time wherein applying a probabilistic jitter (a discontinuity) to the "end(t)" counter cannot affect the output signal and so cannot generate runt pulses or other signal artifacts. The signal 1670 shows the output pulse width (amplitude), phase and frequency modulated signal.

Figure 6C:
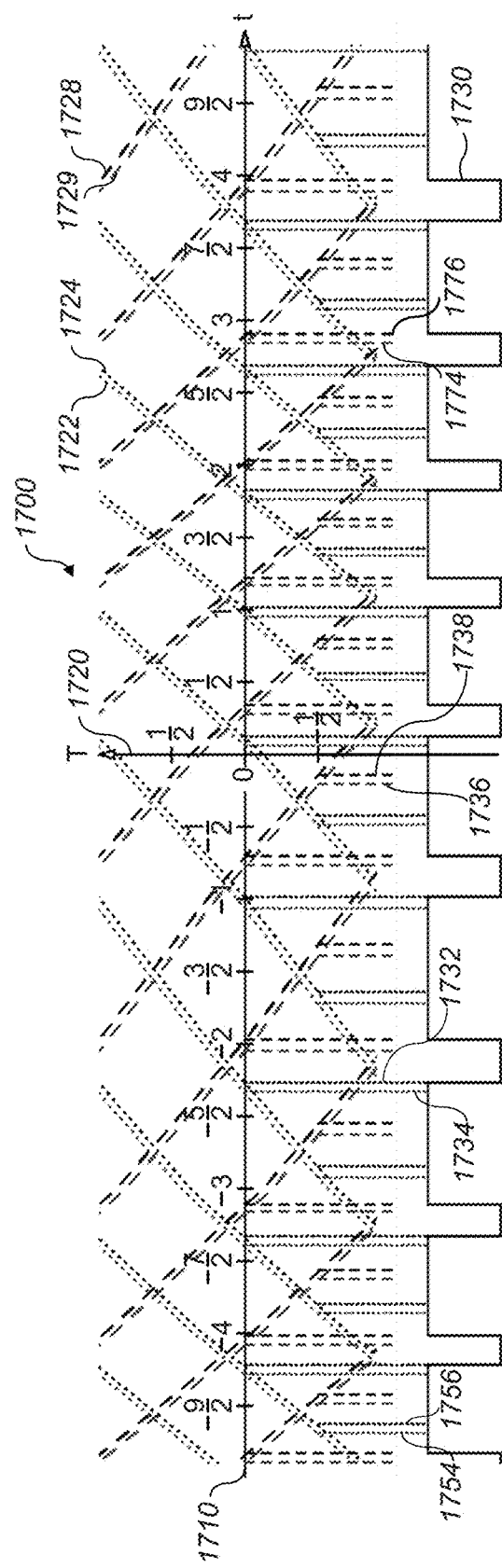

FIG. 6C shows a plot 1700 of "begin(t)" (dashed) and "end(t)" (dotted) with an exaggerated extent of the unweighted dither shown as paler dashed ("begin(t)") and paler dotted ("end(t)") and how this might modify the output signal shown by introducing uncertainty in the edge locations. The x-axis 1710 shows the again normalized time (in base frequency periods) t. The y-axis 1720 shows T which can be interpreted as the fractional number of periods of the output signal. The darker dashed diagonal lines 1728 show the function "begin(t)" which is $\theta'(t)-t$ shifted by $(\Delta'(t))/2$ to produce at zero (T=0) the rising edge of the output signal. The paler dashed diagonal lines 1729 show the function "begin(t)", but this time shifted by the maximum quantity of dither to define between the diagonal lines 1729 and 1728 the range of possible locations for a dithered diagonal line representing the function "begin(t)". The darker dotted diagonal lines 1724 show the function "end(t)" which is $\theta'(t)-t$ shifted in the opposite direction by $(\Delta'(t))/2$ to produce at zero (T=0) the other edge, correspondingly the falling edge of the output signal. The paler dotted diagonal lines 1722 show the function "end(t)", but this time shifted by the maximum quantity of dither to define between the diagonal lines 1722 and 1724 the range of possible locations for a dithered diagonal line representing the function "end (t)". The darker vertical dashed line 1776 corresponds to the point where the darker dashed diagonal line 1728 crosses T=0, the x-axis, which projects down onto the latest possible rising edge of the output signal. The paler vertical dashed line 1774 corresponds to the point where the paler dashed diagonal line 1729 crosses T=0, the x-axis, which projects down onto the earliest possible rising edge of the output signal. The darker vertical dotted line 1732 corresponds to the point where the darker dotted diagonal line 1724 crosses T=0, the x-axis, which projects down onto the latest possible falling edge of the output signal. The paler vertical dotted line 1734 corresponds to the point where the paler dotted diagonal line 1722 crosses T=0, the x-axis, which projects down onto the earliest possible falling edge of the output signal. The darker vertical dashed line 1738 corresponds to the latest point in time and the paler vertical dashed line 1736 corresponds to the earliest point in time where the dashed diagonal line 1728, 1729 crosses the T=(+/−)½, which is the antipodean point to the rising edge and defines a location in time wherein applying a probabilistic jitter (a discontinuity) to the "begin(t)" counter cannot affect the output signal and so cannot generate runt pulses or other signal artifacts, even though this is dependent on the very counter to which dither is applied. The darker vertical dotted line 1756 corresponds to the latest point in time and the paler vertical dotted line 1754 corresponds to the earliest point in time where the dotted diagonal lines 1722, 1724 crosses the T=(+/−)½, which is the antipodean point to the falling edge and defines a location in time wherein applying a probabilistic jitter (a discontinuity) to the "end(t)" counter cannot affect the output signal and so cannot generate runt pulses or other signal artifacts, even though this is dependent on the very counter to which dither is applied. The signal 1730 is for reference an output signal created from the latest possible (un-dithered) counters, showing that there is a consistent systematic probabilistic bias of half of the dither width which may be neglected.

Figure 6D:
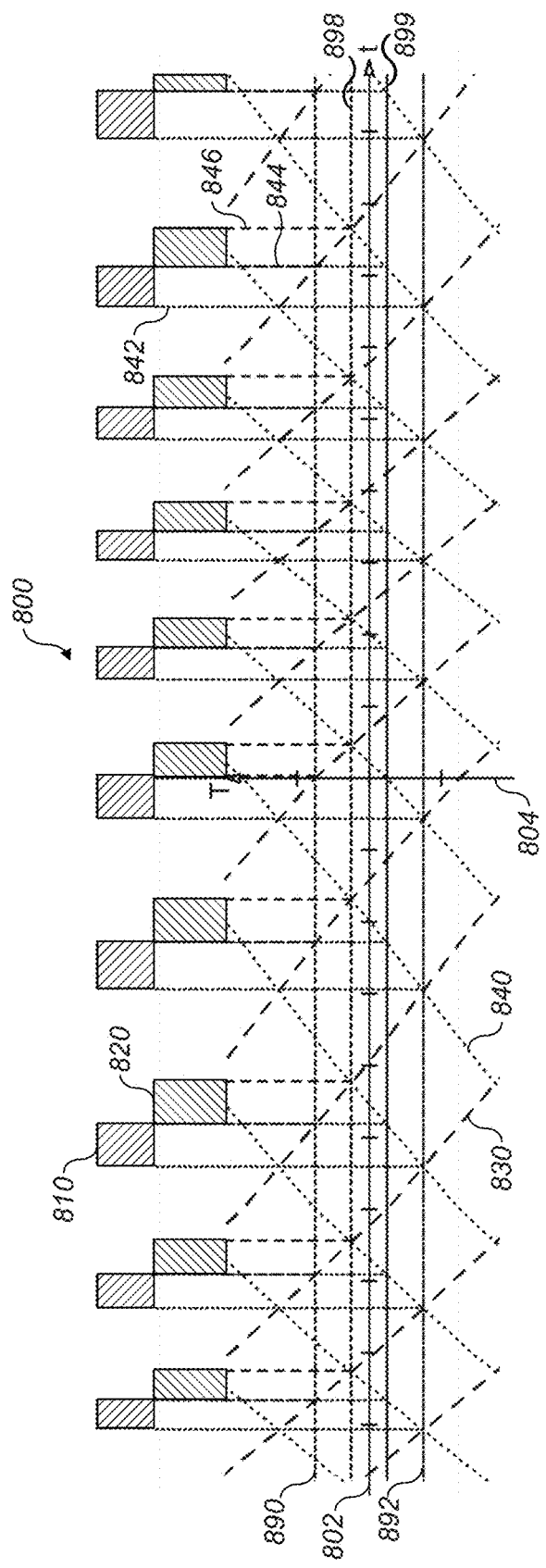

FIG. 6D shows a plot 800 of the reinitialization times (hatched boxes) of the dither values $[\text{"begin"}]\_\delta$ and $[\text{"end"}]\_\delta$, note that hatched boxes for the "begin(t)" cannot occur during an edge whose location may be changed by different value for $[\text{"begin"}]\_\delta$ and vice versa. The x-axis 802 shows the again normalized time (in base frequency periods) t. The y-axis 804 shows T which can be interpreted as the fractional number of periods of the output signal. The dashed diagonal lines 830 show the function "begin(t)" which is θ'(t)−t shifted by (Δ'(t))/2 to produce at zero (T=0) the rising edge of the output signal, but at other values of T (such as between the dashed horizontal lines T=+⅛ 898 and T=+⅜) 890 can be used to determine an appropriate window in which to apply a discontinuity in the form of probabilistic jitter to the counter "begin(t)" and thus the rising edge. The dotted diagonal lines 840 show the function "end(t)" which is θ'(t)−t shifted by (Δ'(t))/2 to produce at zero (T=0) the falling edge of the output signal, but at other values of T (such as between the dotted horizontal lines T=−⅜ 892 and T=−⅛ 899) can be used to determine an appropriate window in which to apply a discontinuity in the form of probabilistic jitter to the counter "end(t)" and thus the falling edge. The co-located dotted and dashed line 844 and vertical dashed line 846 denote the beginning and end of the region of time generated by the projection of T, in which it is valid to discontinuously modify the jitter of the function "begin(t)" safely, illustrated as left-side lined boxes 820. The vertical dotted line 842 and the co-located dotted and dashed line 844 denote the beginning and end of the region of time generated by the projection of T, in which it is valid to discontinuously modify the jitter of the function "end(t)" safely, illustrated as right-side lined boxes 810. The boxes 810 and 820, it should be noted, now occur in the opposite order to FIG. 5D.

III. Conclusion

While the foregoing descriptions disclose specific values, any other specific values may be used to achieve similar results. Further, the various features of the foregoing embodiments may be selected and combined to produce numerous variations of improved haptic systems.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has". "having," "includes". "including," "contains". "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art. The term "coupled" as used herein is defined as connected, although not necessarily directly and not necessarily mechanically. A device or structure that is "configured" in a certain way is configured in at least that way but may also be configured in ways that are not listed.

The Abstract of the Disclosure is provided to allow the reader to quickly ascertain the nature of the technical disclosure. It is submitted with the understanding that it w % ill not be used to interpret or limit the scope or meaning of the claims. In addition, in the foregoing Detailed Description, various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:
1. A system comprising:
   an electrical signal wherein the electrical signal has a plurality of pulse edges and is driven by an amplitude pulse width modulation and by a phase pulse width modulation;

wherein at least one of the plurality of pulse edges is perturbed by dither on a phase angle drawn from a statistical distribution;
wherein the statistical distribution is dependent on a time-based function of phase change at each of the plurality of pulse edges.

2. The system as in claim 1, wherein more dither is applied when an instantaneous carrier is at lower frequencies and less dither is applied when an instantaneous carrier is at higher frequencies.

3. The system as in claim 1, wherein the dither comprises two dither values, wherein a first of the two dither values is produced for a begin counter begin (t), and a second of the two dither values is produced for an end counter end (t).

4. The system as in claim 3, wherein begin (t) and end (t) are defined as integer values:

$$begin_\delta := 2(2^P \times \text{uniformRandom}([0,1))),$$

$$end_\delta := 2(2^P \times \text{uniformRandom}([0,1)));$$

where a result in each case is a uniformly distributed random integer value in an interval $[0, 2^{p+1}-1]$.

5. The system as in claim 4, wherein reinitialization of each of begins and ends occurs at time where at least one of the plurality of pulse edges does not fall.

6. The system as in claim 5, wherein a jump in the dither values begins and ends do not affect the plurality of pulse edges.

7. This system as in claim 6, wherein the jump occurs during parts of a counter cycle where most significant bits for each counter place them outside of any region where their sign may affect the location of an edge.

8. The system as in claim 4, wherein the same dither value does not apply for at least two of the plurality of pulse edges.

9. The system as in claim 3, wherein begin (t) and end (t) are defined as integer values:

$$begin_\delta := 2(2^P \times \text{uniformRandom}([0,1))),$$

$$end_\delta := 2(2^P \times \text{uniformRandom}([0,1)));$$

where a result in each case is implemented as a linear-feedback shift register and is randomly distributed in an interval $[1, 2^{p+1}-1]$.

10. The system as in claim 3, wherein $$begin_d(t) := begin_0 + \frac{dbegin}{dt}k - begin_\delta.$$

$$end_d(t) := end_0 + \frac{dend}{dt}k + end_\delta, ;$$

and wherein the first of the two dither values is applied with a positive sign and the second of the two dither values is applied with a negative sign.

11. The system as in claim 10, wherein $begin_d(t)$ and $end_d(t)$ expand to:

$$begin_d(t) :=$$
$$-2^{2p}\left(\Delta_0' - 2\left(\theta_0' - \frac{begin_\delta}{2^{p+1}}\right)\right) - 2^p((\Delta_1' - \Delta_0') - (2 - (2\theta_1' - 2\theta_0')))k - 1,$$

$$end_d(t) := -2^{2p}\left(\Delta_0' + 2\left(\theta_0' - \frac{end_\delta}{2^{p+1}}\right)\right) - 2^p((\Delta_1' - \Delta_0') + (2 - (2\theta_1' - 2\theta_0')))k.$$

* * * * *